United States Patent
Berman et al.

(10) Patent No.: US 12,267,086 B2
(45) Date of Patent: Apr. 1, 2025

(54) HIGH THROUGHPUT POLAR CODEWORD DECODING BY DECODING BCH SUB-CODE IN POLAR CODE STRUCTURE

(71) Applicant: SAMSUNG ELECTRONICS CO., LTD., Suwon-si (KR)

(72) Inventors: Amit Berman, Tel-Aviv (IL); Dikla Shapiro, Tel-Aviv (IL); Idan Dekel, Tel-Aviv (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 4 days.

(21) Appl. No.: 18/196,244

(22) Filed: May 11, 2023

(65) Prior Publication Data
US 2024/0380417 A1 Nov. 14, 2024

(51) Int. Cl.
*H03M 13/15* (2006.01)
*H03M 13/00* (2006.01)

(52) U.S. Cl.
CPC ....... *H03M 13/152* (2013.01); *H03M 13/616* (2013.01)

(58) Field of Classification Search
CPC ............... H03M 13/152; H03M 13/616
See application file for complete search history.

(56) References Cited

U.S. PATENT DOCUMENTS

| | | | |
|---|---|---|---|
| 11,108,407 B1 * | 8/2021 | Lu | H03M 13/1111 |
| 11,984,910 B1 * | 5/2024 | Fan | G06N 3/044 |
| 2013/0117344 A1 * | 5/2013 | Gross | H03M 13/6563 708/490 |
| 2015/0188570 A1 * | 7/2015 | Kwok | G06F 11/08 714/764 |
| 2017/0179980 A1 | 6/2017 | Lin et al. | |
| 2017/0279468 A1 | 9/2017 | Kumar et al. | |

(Continued)

OTHER PUBLICATIONS

Wang et al., "An Improved Concatenation Scheme of BCH-Polar Codes With Low-Latency Decoding Architecture", IEEE Access, Jul. 23, 2019, pp. 95867-95877, vol. 7, XP011737376, doi:10.1109/ACCESS.2019.2929188.

(Continued)

*Primary Examiner* — Samir W Rizk
(74) *Attorney, Agent, or Firm* — Sughrue Mion, PLLC

(57) ABSTRACT

Systems, devices, and methods for decoding information bits obtained from storage, including obtaining a frame corresponding to a codeword from the storage device, performing a first decoding operation on the frame, based on the first decoding operation indicating that a number of errors is greater than a predetermined number, selecting at least one potential error bit, and perform a second decoding operation based on the at least one potential error bit, based on the second decoding operation indicating that the number of errors is not equal to the predetermined number plus one, determining that the frame is not correctable by the first decoding operation and the second decoding operation, and based on the second decoding operation indicating that the number of errors is equal to the predetermined number plus one, correcting the frame based on a result of the second decoding operation to obtain a corrected frame, and obtaining information bits corresponding to the codeword based on the corrected frame.

20 Claims, 19 Drawing Sheets

(56) References Cited

U.S. PATENT DOCUMENTS

| | | |
|---|---|---|
| 2019/0260397 A1 | 8/2019 | Wu et al. |
| 2021/0105087 A1* | 4/2021 | Xu .................... H04L 1/0086 |
| 2023/0115877 A1* | 4/2023 | Luo .................... G06N 3/044 |
| | | 714/764 |
| 2024/0072826 A1* | 2/2024 | Lu .................. H03M 13/6318 |

OTHER PUBLICATIONS

Communication dated Sep. 19, 2024, issued by European Patent Office in European Patent Application No. 24166781.5.

* cited by examiner

HIGH THROUGHPUT POLAR CODEWORD DECODING BY DECODING BCH SUB-CODE IN POLAR CODE STRUCTURE

BACKGROUND

1. Field

Apparatuses and methods consistent with embodiments relate to a process for performing error correction coding, more particularly decoding polar codewords using Bose-Chaudhuri-Hocquenghem (BCH) sub-codes

2. Description of Related Art

Data storage components may use error correction codes (ECC) to correct data corruption which may occur in a memory. Some types of ECC coding, for example ECC coding using a polar or SPolar generalized concatenated code (GCC) coding scheme.

However, polar decoding schemes may involve resource-intensive operations which may reduce a throughput in a decoding phase. Therefore, there is a need for a decoding scheme which simplifies the decoding process in order to improve throughput.

SUMMARY

Provided are systems, apparatuses, and methods for managing a storage device by decoding polar codewords using Bose-Chaudhuri-Hocquenghem (BCH) sub-codes.

Additional aspects will be set forth in part in the description which follows and, in part, will be apparent from the description, or may be learned by practice of the presented embodiments.

In accordance with an aspect of the disclosure, a storage system includes a storage device configured to store a plurality of codewords; and at least one processor configured to: obtain a frame corresponding to a codeword from the storage device, perform a first decoding operation on the frame, based on the first decoding operation indicating that a number of errors is greater than a predetermined number, select at least one potential error bit, and perform a second decoding operation based on the at least one potential error bit, based on the second decoding operation indicating that the number of errors is not equal to the predetermined number plus one, determine that the frame is not correctable by the first decoding operation and the second decoding operation, and based on the second decoding operation indicating that the number of errors is equal to the predetermined number plus one, correct the frame based on a result of the second decoding operation to obtain a corrected frame, and obtain information bits corresponding to the codeword based on the corrected frame.

In accordance with an aspect of the disclosure, a device for decoding a codeword which includes a plurality of frames includes at least one processor configured to: obtain a frame corresponding to the codeword from a storage device, perform first Bose-Chaudhuri-Hocquenghem (BCH) decoding on the frame, based on the first BCH decoding indicating that a number of errors is greater than a predetermined number, select at least one potential error bit, and perform second BCH decoding based on the at least one potential error bit, based on the second BCH decoding indicating that the number of errors is not equal to the predetermined number plus one, determine that the frame is not correctable by the first BCH decoding and the second BCH decoding, and based on the second BCH decoding indicating that the number of errors is equal to the predetermined number plus one, correct the frame based on a result of the second BCH decoding to obtain a corrected frame, and obtain information bits corresponding to the codeword based on the corrected frame.

In accordance with an aspect of the disclosure, a method of controlling a storage system is executed by at least one processor and includes obtaining a codeword from a storage device, wherein the codeword includes a plurality of frames, obtaining a frame from among the plurality of frames; performing a first decoding operation on the frame; based on the first decoding operation indicating that a number of errors is greater than a predetermined number, selecting at least one potential error bit, and performing a second decoding operation based on the at least one potential error bit; based on the second decoding operation indicating that the number of errors is not equal to the predetermined number plus one, determining that the frame is not correctable by the first decoding operation and the second decoding operation; and based on the second decoding operation indicating that the number of errors is equal to the predetermined number plus one, correcting the frame based on a result of the second decoding operation to obtain a corrected frame; and obtaining information bits corresponding to the codeword based on the corrected frame.

In accordance with an aspect of the disclosure, a method for decoding a codeword is executed by at least one processor and includes obtaining a frame corresponding to the codeword from a storage device, performing first Bose-Chaudhuri-Hocquenghem (BCH) decoding on the frame, based on the first BCH decoding indicating that a number of errors is greater than a predetermined number, selecting at least one potential error bit, and performing second BCH decoding based on the at least one potential error bit, based on the second BCH decoding indicating that the number of errors is not equal to the predetermined number plus one, determining that the frame is not correctable by the first BCH decoding and the second BCH decoding, and based on the second BCH decoding indicating that the number of errors is equal to the predetermined number plus one, correcting the frame based on a result of the second BCH decoding to obtain a corrected frame, and obtaining information bits corresponding to the codeword based on the corrected frame.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

In particular, the ECC code may be selected such that the ECC encoding uses a Bose-Chaudhuri-Hocquenghem (BCH) code as a sub-code of the polar code. Therefore, according to embodiments, an encoded row, which may be referred to as a frame, may be or include both a polar codeword and a BCH codeword, and therefore may satisfy both polar and BCH requirements.

For example, t may represent a number of errors which are correctable by a particular BCH code or a particular BCH decoder, and may be referred to as an error correcting capability. In embodiments, BCH codes having t=2 may be subcodes of a polar code. Specifically, the first two syndromes of a BCH code may be determined based on polar parity, for example polar parity bits included in a polar codeword, and therefore may be obtained by permutating the bits of the polar codeword.

BCH codes having an error correcting capability of t=2 may have 2 syndromes, and therefore may correct up to two erroneous bits. In embodiments, an error correcting capability of t=2 may not be sufficient to correct every error in a polar codeword. However, BCH decoding may be very efficient, and therefore very fast, in comparison with polar decoding. As a result, the overall throughput of a decoder may be improved by using BCH decoding, even if only some of the frames succeed.

Accordingly, embodiments may relate to decoding at least some of a plurality of polar frames using a BCH decoder, which may significantly increase overall throughput even if the BCH decoder is not able to decode every polar frame.

Figure 1:
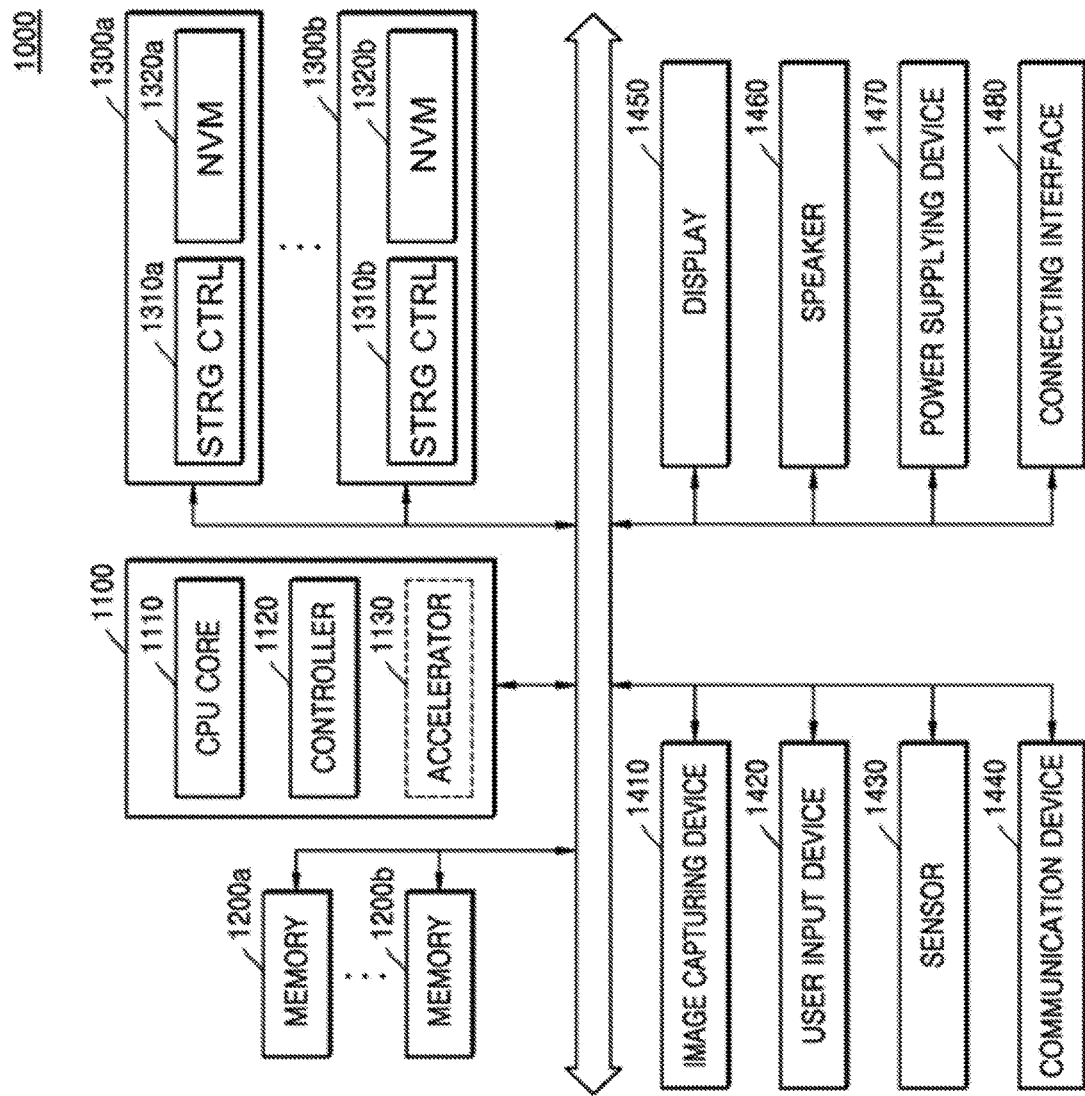
FIG. 1 is a block diagram of a computer system, according to embodiments.

FIG. 1 is a diagram of a system 1000 to which embodiments may be applied. The system 1000 of FIG. 1 may be, for example, a mobile system, such as a portable communication terminal (e.g., a mobile phone), a smartphone, a tablet personal computer (PC), a wearable device, a healthcare device, or an Internet of things (IoT) device. However, the system 1000 of FIG. 1 is not necessarily limited to the mobile system and may be a PC, a laptop computer, a server, a media player, or an automotive device (e.g., a navigation device).

Referring to FIG. 1, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers (STRG CTRL) 1310a and 1310b and Non-Volatile Memories (NVMs) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, embodiments are not limited thereto, and the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of SSDs or memory cards, and may be removably combined with other components of the system 1000 through an interface, such as the connecting interface 1480 described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery embedded in the system 1000 and/or an external power source, and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

Figure 2A:
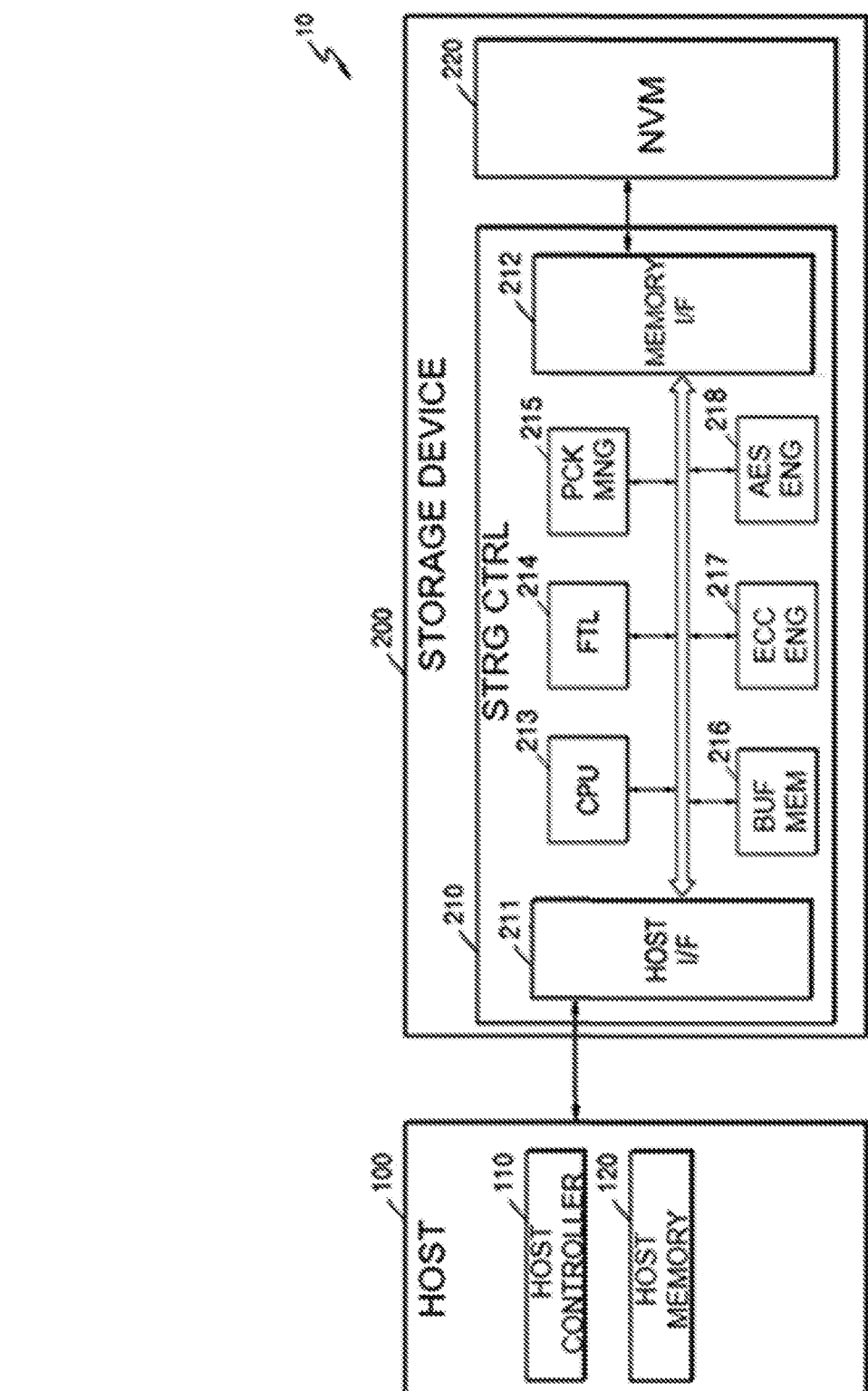
FIG. 2A is a block diagram of a host storage system, according to embodiments.

FIG. 2A is a block diagram of a host storage system 10 according to an example embodiment.

The host storage system 10 may include a host 100 and a storage device 200. Further, the storage device 200 may include a storage controller 210 and an NVM 220. According to an example embodiment, the host 100 may include a host controller 110 and a host memory 120. The host memory 120 may serve as a buffer memory configured to temporarily store data to be transmitted to the storage device 200 or data received from the storage device 200.

The storage device 200 may include storage media configured to store data in response to requests from the host 100. As an example, the storage device 200 may include at least one of an SSD, an embedded memory, and a removable external memory. When the storage device 200 is an SSD, the storage device 200 may be a device that conforms to an NVMe standard. When the storage device 200 is an embedded memory or an external memory, the storage device 200 may be a device that conforms to a UFS standard or an eMMC standard. Each of the host 100 and the storage device 200 may generate a packet according to an adopted standard protocol and transmit the packet.

When the NVM 220 of the storage device 200 includes a flash memory, the flash memory may include a 2D NAND memory array or a 3D (or vertical) NAND (VNAND) memory array. As another example, the storage device 200 may include various other kinds of NVMs. For example, the storage device 200 may include magnetic RAM (MRAM), spin-transfer torque MRAM, conductive bridging RAM (CBRAM), ferroelectric RAM (FRAM), PRAM, RRAM, and various other kinds of memories.

According to an embodiment, the host controller 110 and the host memory 120 may be implemented as separate semiconductor chips. Alternatively, in some embodiments, the host controller 110 and the host memory 120 may be integrated in the same semiconductor chip. As an example, the host controller 110 may be any one of a plurality of modules included in an application processor (AP). The AP may be implemented as a System on Chip (SoC). Further, the host memory 120 may be an embedded memory included in the AP or an NVM or memory module located outside the AP.

The host controller 110 may manage an operation of storing data (e.g., write data) of a buffer region of the host memory 120 in the NVM 220 or an operation of storing data (e.g., read data) of the NVM 220 in the buffer region.

The storage controller 210 may include a host interface 211, a memory interface 212, and a CPU 213. Further, the storage controller 210 may further include a flash translation layer (FTL) 214, a packet manager 215, a buffer memory 216, an error correction code (ECC) engine 217, and an advanced encryption standard (AES) engine 218. The storage controller 210 may further include a working memory in which the FTL 214 is loaded. The CPU 213 may execute the FTL 214 to control data write and read operations on the NVM 220.

The host interface 211 may transmit and receive packets to and from the host 100. A packet transmitted from the host 100 to the host interface 211 may include a command or data to be written to the NVM 220. A packet transmitted from the host interface 211 to the host 100 may include a response to the command or data read from the NVM 220. The memory interface 212 may transmit data to be written to the NVM 220 to the NVM 220 or receive data read from the NVM 220. The memory interface 212 may be configured to comply with a standard protocol, such as Toggle or open NAND flash interface (ONFI).

The FTL 214 may perform various functions, such as an address mapping operation, a wear-leveling operation, and a garbage collection operation. The address mapping operation may be an operation of converting a logical address received from the host 100 into a physical address used to actually store data in the NVM 220. The wear-leveling operation may be a technique for preventing excessive deterioration of a specific block by allowing blocks of the NVM 220 to be uniformly used. As an example, the wear-leveling operation may be implemented using a firmware technique that balances erase counts of physical blocks. The garbage collection operation may be a technique for ensuring usable capacity in the NVM 220 by erasing an existing block after copying valid data of the existing block to a new block.

The packet manager 215 may generate a packet according to a protocol of an interface, which consents to the host 100, or parse various types of information from the packet received from the host 100. In addition, the buffer memory 216 may temporarily store data to be written to the NVM 220 or data to be read from the NVM 220. Although the buffer memory 216 may be a component included in the storage controller 210, the buffer memory 216 may be outside the storage controller 210.

The ECC engine 217 may perform error detection and correction operations on read data read from the NVM 220. More specifically, the ECC engine 217 may generate parity bits for write data to be written to the NVM 220, and the generated parity bits may be stored in the NVM 220 together with write data. During the reading of data from the NVM 220, the ECC engine 217 may correct an error in the read data by using the parity bits read from the NVM 220 along with the read data, and output error-corrected read data.

The AES engine 218 may perform at least one of an encryption operation and a decryption operation on data input to the storage controller 210 by using a symmetric-key algorithm.

Figure 2B:
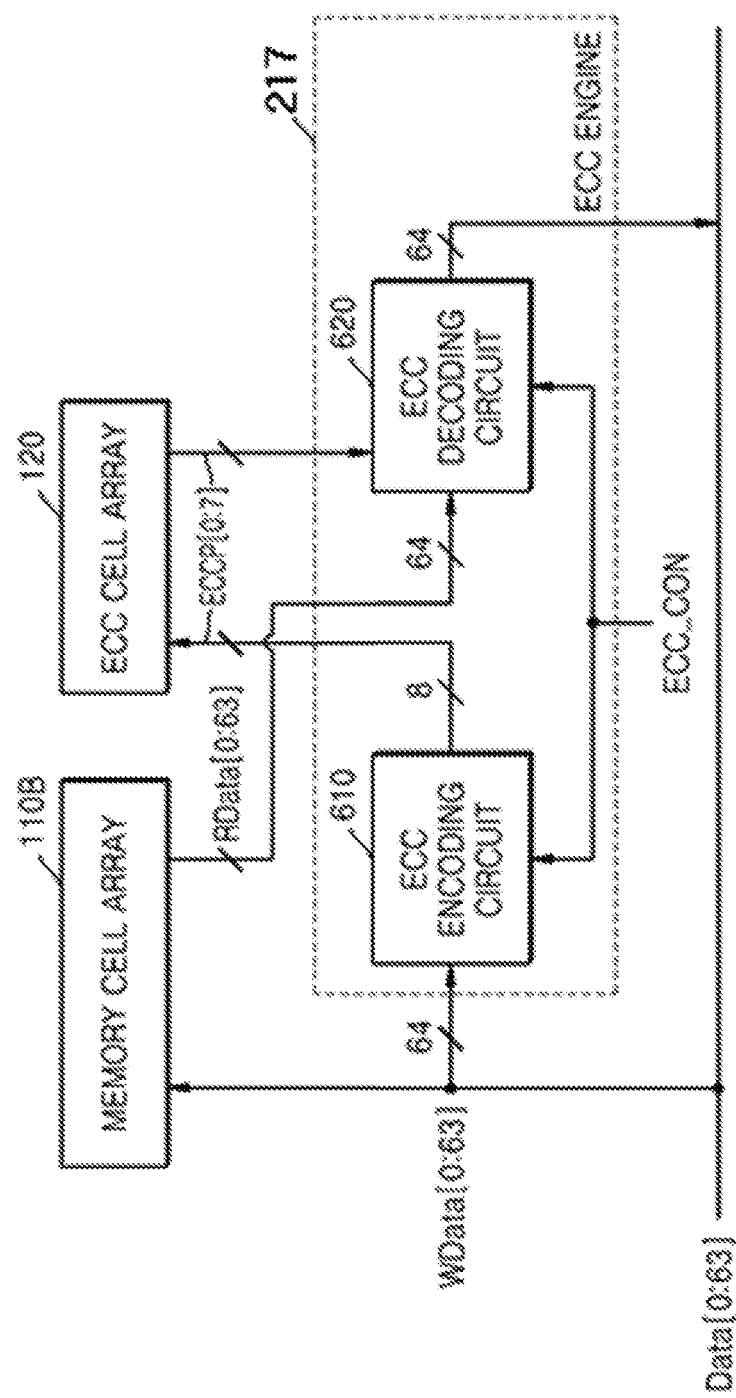
FIG. 2B is a block diagram of an ECC engine, according to embodiments.

FIG. 2B is a detailed diagram of the ECC engine 217 of FIG. 2A. Referring to FIG. 2B, the ECC engine 217 may include an ECC encoding circuit 510 and an ECC decoding circuit 520. In response to an ECC control signal ECC_CON, the ECC encoding circuit 510 may generate parity bits ECCP [0:7] for write data WData[0:63] to be written to memory cells of a memory cell array 221. The parity bits ECCP [0:7] may be stored in an ECC cell array 223. According to embodiments, in response to the ECC control signal ECC_CON, the ECC encoding circuit 510 may generate parity bits ECCP [0:7] for write data WData [0:63] to be written to memory cells including a defective cell of the memory cell array 221.

In response to the ECC control signal ECC_CON, the ECC decoding circuit 520 may correct error bit data by using read data RData[0:63] read from the memory cells of the memory cell array 221 and parity bits ECCP [0:7] read from the ECC cell array 223 and output error-corrected data Data[0:63]. According to embodiments, in response to the ECC control signal ECC_CON, the ECC decoding circuit 520 may correct error bit data by using read data RData[0:63] read from memory cells including a defective cell of the memory cell array 221 and parity bits ECCP [0:7] read from the ECC cell array 223, and output error-corrected data Data[0:63].

Figure 2C:
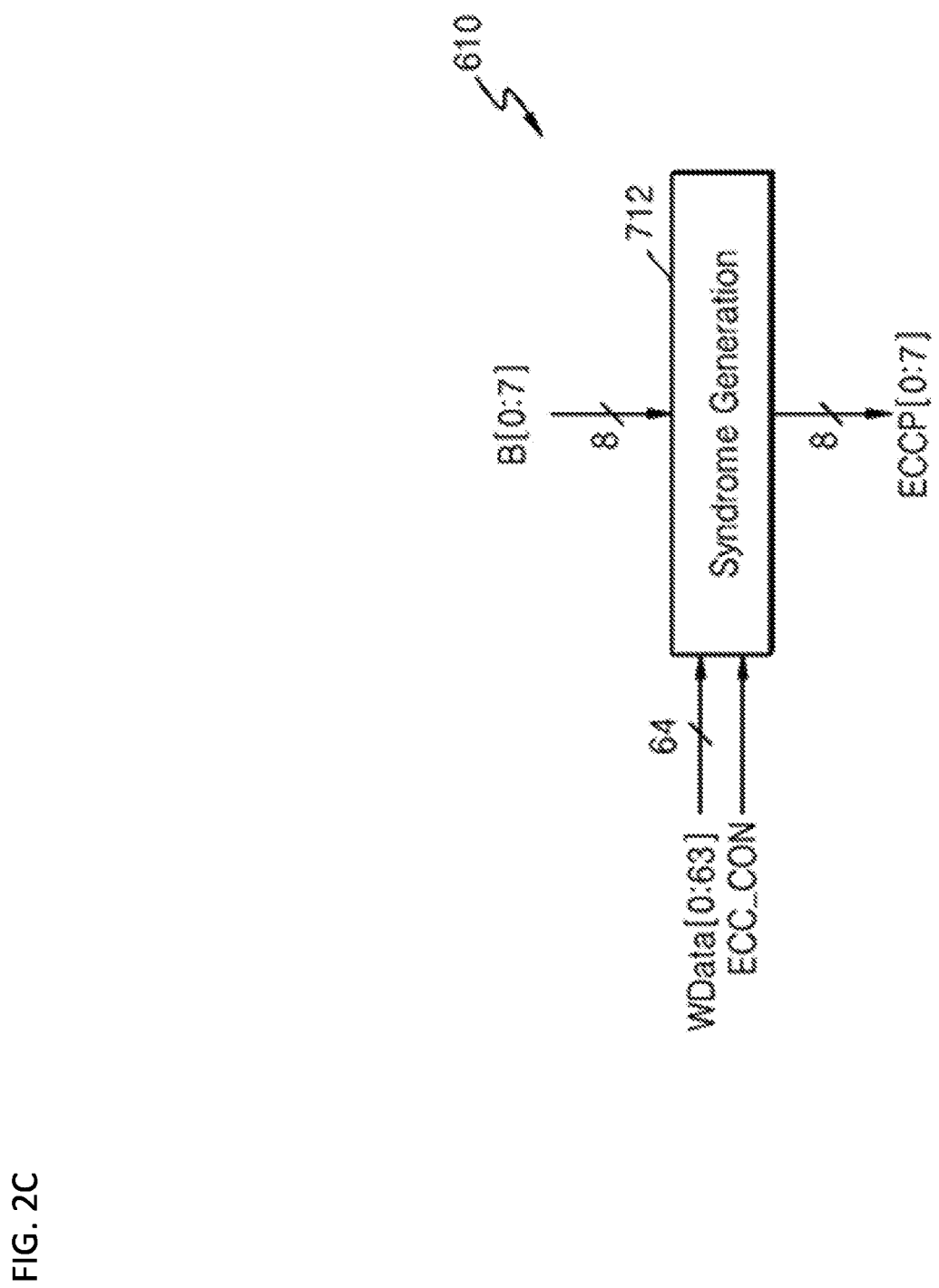
FIG. 2C is a block diagram of an ECC encoding circuit, according to embodiments.

FIG. 2C is a diagram of the ECC encoding circuit 510 of FIG. 2B.

Referring to FIG. 2C, the ECC encoding circuit 510 may include a parity generator 511, which receives 64-bit write data WData[0:63] and basis bits B [0:7] in response to an ECC control signal ECC_CON and generates parity bits ECCP [0:7] by using an XOR array operation. The basis bits B [0:7] may be bits for generating parity bits ECCP [0:7] for 64-bit write data WData[0:63], for example, b'00000000 bits. The basis bits B [0:7] may use other specific bits instead of b'00000000 bits.

Figure 2D:
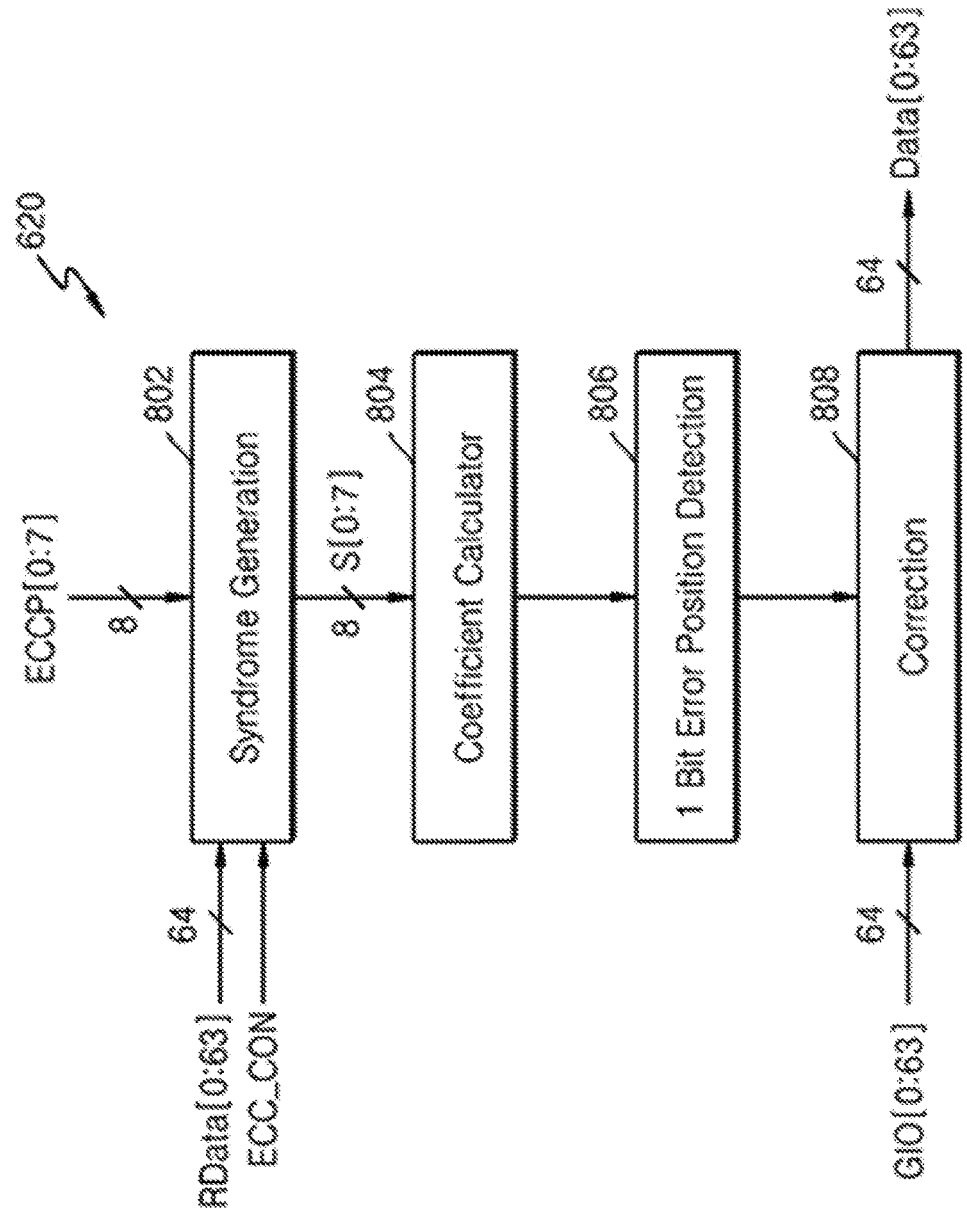
FIG. 2D is a block diagram of an ECC decoding circuit, according to embodiments.

FIG. 2D is a diagram of an ECC decoding circuit 520 of FIG. 2B.

Referring to FIG. 2D, the ECC decoding circuit 520 may include a syndrome generator 521, a coefficient calculator 522, a 1-bit error position detector 523, and an error corrector 524. The syndrome generator 521 may receive 64-bit read data and an 8-bit parity bit ECCP [0:7] in response to an ECC control signal ECC_CON and generate syndrome data S [0:7] by using an XOR array operation. The coefficient calculator 522 may calculate a coefficient of an error position equation by using the syndrome data S [0:7]. The error position equation may be an equation that takes a reciprocal of an error bit as a root. The 1-bit error position detector 523 may calculate a position of a 1-bit error by using the calculated error position equation. The error corrector 524 may determine the position of the 1-bit error based on a detection result of the 1-bit error position detector 523. The error corrector 524 may correct an error by inverting a logic value of a bit of which an error occurs, from among 64-bit read data RData[0:63], based on determined 1-bit error position information, and output error-corrected 64-bit data Data[0:63]. In embodiments, the error position equation may correspond to the ELP described herein.

Figure 2E:
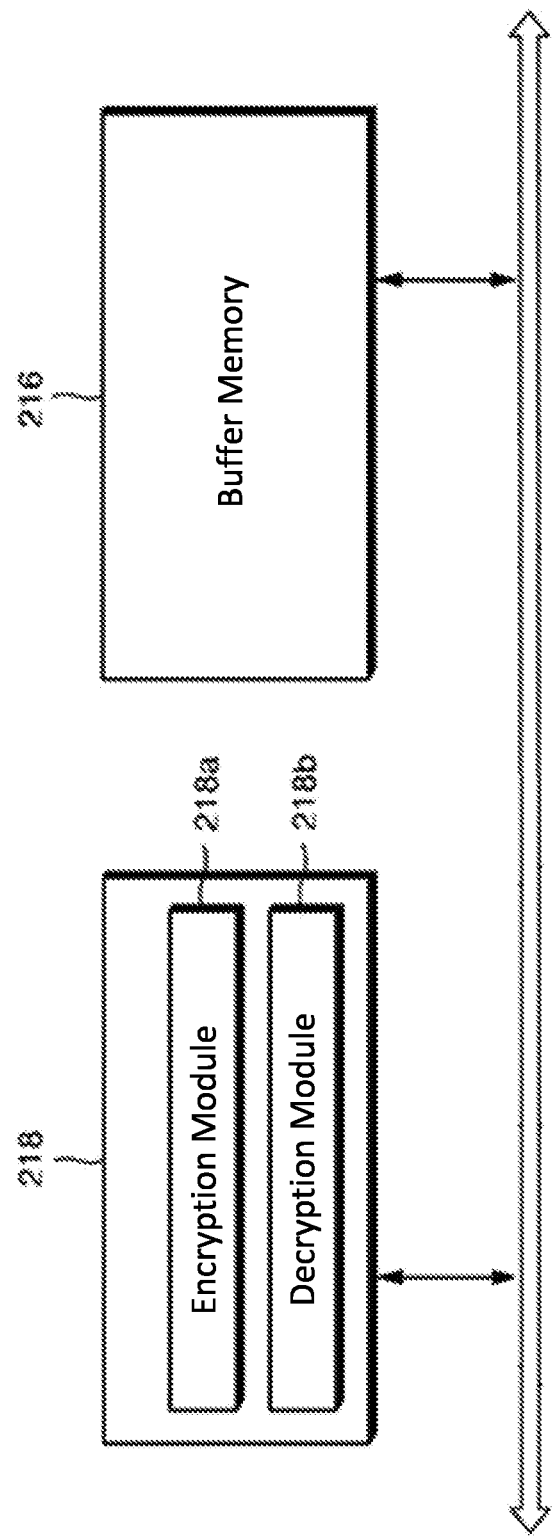
FIG. 2E is a block diagram of an AES engine, according to embodiments.

FIG. 2E is a detailed diagram of the AES engine 218 of FIG. 2A. The AES engine 218 may encrypt and decrypt data by using an AES algorithm and include an encryption module 218*a* and a decryption module 218*b*. Although FIG. 2E illustrates a case in which the encryption module 218*a* and the decryption module 218*b* are implemented as separate modules, in another case, one module capable of performing both encryption and decryption operations may be implemented in the AES engine 218. A buffer memory 216 may be a volatile memory serving as a buffer or be an NVM.

The AES engine 218 may receive first data transmitted from the buffer memory 216. The encryption module 218*a* may encrypt the first data, which is transmitted from the buffer memory 216, by using an encryption key and generate second data. The second data may be transmitted from the AES engine 218 to the buffer memory 216, and be stored in the buffer memory 216.

In addition, the AES engine 218 may receive third data transmitted from the buffer memory 216. The third data may be data that is encrypted with the same encryption key as an encryption key used to encrypt the first data. The decryption module 218*b* may decrypt the third data, which is transmitted from the buffer memory 216, with the same encryption key as the encryption key used to encrypt the first data and generate fourth data. The fourth data may be transmitted from the AES engine 218 to the buffer memory 216, and be stored in the buffer memory 216.

Figure 3:
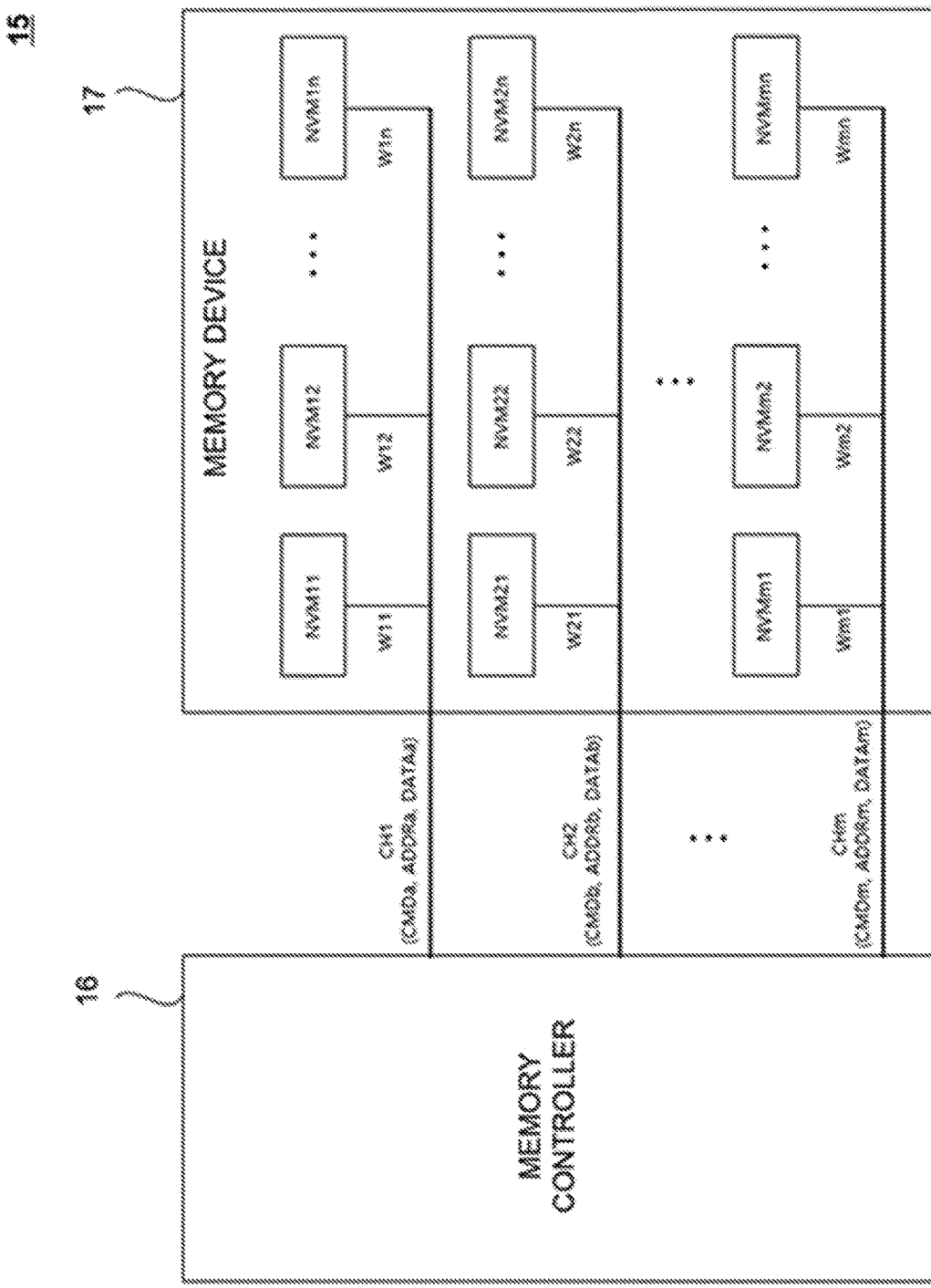
FIG. 3 is a block diagram of a memory system, according to embodiments.

FIG. 3 is a block diagram of a memory system 15 according to embodiments. Referring to FIG. 3, the memory system 15 may include a memory device 17 and a memory controller 16. The memory system 15 may support a plurality of channels CH1 to CHm, and the memory device 17 may be connected to the memory controller 16 through the plurality of channels CH1 to CHm. For example, the memory system 15 may be implemented as a storage device, such as an SSD.

The memory device 17 may include a plurality of NVM devices NVM11 to NVMmn. Each of the NVM devices NVM11 to NVMmn may be connected to one of the plurality of channels CH1 to CHm through a way corresponding thereto. For instance, the NVM devices NVM11 to NVM1$n$ may be connected to a first channel CH1 through ways W11 to W1$n$, and the NVM devices NVM21 to NVM2$n$ may be connected to a second channel CH2 through ways W21 to W2$n$. In an example embodiment, each of the NVM devices NVM11 to NVMmn may be implemented as an arbitrary memory unit that may operate according to an individual command from the memory controller 16. For example, each of the NVM devices NVM11 to NVMmn may be implemented as a chip or a die, but the embodiments of the disclosure are not limited thereto.

The memory controller 16 may transmit and receive signals to and from the memory device 17 through the plurality of channels CH1 to CHm. For example, the memory controller 16 may transmit commands CMDa to CMDm, addresses ADDRa to ADDRm, and data DATAa to DATAm to the memory device 17 through the channels CH1 to CHm or receive the data DATAa to DATAm from the memory device 17.

The memory controller 16 may select one of the NVM devices NVM11 to NVMmn, which is connected to each of the channels CH1 to CHm, by using a corresponding one of the channels CH1 to CHm, and transmit and receive signals to and from the selected NVM device. For example, the memory controller 16 may select the NVM device NVM11 from the NVM devices NVM11 to NVM1$n$ connected to the first channel CH1. The memory controller 16 may transmit the command CMDa, the address ADDRa, and the data DATAa to the selected NVM device NVM11 through the first channel CH1 or receive the data DATAa from the selected NVM device NVM11.

The memory controller 16 may transmit and receive signals to and from the memory device 17 in parallel through different channels. For example, the memory controller 16 may transmit a command CMDb to the memory device 17 through the second channel CH2 while transmitting a command CMDa to the memory device 17 through the first channel CH1. For example, the memory controller 16 may receive data DATAb from the memory device 17 through the second channel CH2 while receiving data DATAa from the memory device 17 through the first channel CH1.

The memory controller 16 may control all operations of the memory device 17. The memory controller 16 may transmit a signal to the channels CH1 to CHm and control each of the NVM devices NVM11 to NVMmn connected to the channels CH1 to CHm. For instance, the memory controller 16 may transmit the command CMDa and the address ADDRa to the first channel CH1 and control one selected from the NVM devices NVM11 to NVM1n.

Each of the NVM devices NVM11 to NVMmn may operate via the control of the memory controller 16. For example, the NVM device NVM11 may program the data DATAa based on the command CMDa, the address ADDRa, and the data DATAa provided to the first channel CH1. For example, the NVM device NVM21 may read the data DATAb based on the command CMDb and the address ADDb provided to the second channel CH2 and transmit the read data DATAb to the memory controller 16.

Although FIG. 3 illustrates an example in which the memory device 17 communicates with the memory controller 16 through m channels and includes n NVM devices corresponding to each of the channels, the number of channels and the number of NVM devices connected to one channel may be variously changed.

Figure 4:
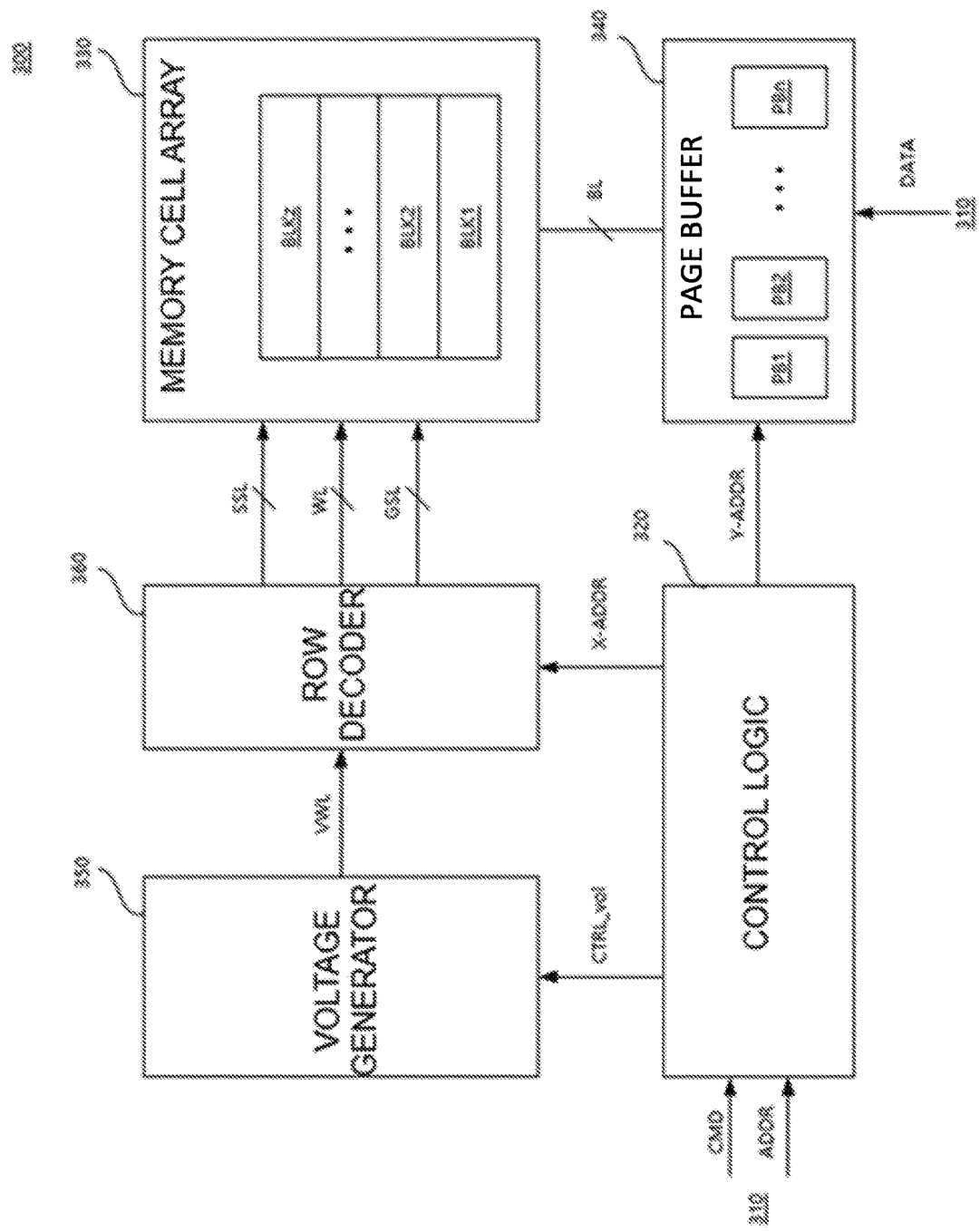
FIG. 4 is a block diagram of a memory device, according to embodiments.

FIG. 4 is a block diagram of a memory device 300 according to an example embodiment. Referring to FIG. 4, the memory device 300 may include a control logic circuitry 320, a memory cell array 330, a page buffer 340, a voltage generator 350, and a row decoder 360. The memory device 300 may further include a memory interface circuitry 310 shown in FIG. 6. In addition, the memory device 300 may further include a column logic, a pre-decoder, a temperature sensor, a command decoder, and/or an address decoder.

The control logic circuitry 320 may control all various operations of the memory device 300. The control logic circuitry 320 may output various control signals in response to commands CMD and/or addresses ADDR from the memory interface circuitry 310. For example, the control logic circuitry 320 may output a voltage control signal CTRL_vol, a row address X-ADDR, and a column address Y-ADDR.

The memory cell array 330 may include a plurality of memory blocks BLK1 to BLKz (here, z is a positive integer), each of which may include a plurality of memory cells. The memory cell array 330 may be connected to the page buffer 340 through bit lines BL and be connected to the row decoder 360 through word lines WL, string selection lines SSL, and ground selection lines GSL.

In an example embodiment, the memory cell array 330 may include a 3D memory cell array, which includes a plurality of NAND strings. Each of the NAND strings may include memory cells respectively connected to word lines vertically stacked on a substrate. The disclosures of U.S. Pat. Nos. 7,679,133; 8,553,466; 8,654,587; 8,559,235; and US Pat. Pub. No. 2011/0233648 are hereby incorporated by reference. In an example embodiment, the memory cell array 330 may include a 2D memory cell array, which includes a plurality of NAND strings arranged in a row direction and a column direction.

The page buffer 340 may include a plurality of page buffers PB1 to PBn (here, n is an integer greater than or equal to 3), which may be respectively connected to the memory cells through a plurality of bit lines BL. The page buffer 340 may select at least one of the bit lines BL in response to the column address Y-ADDR. The page buffer 340 may operate as a write driver or a sense amplifier according to an operation mode. For example, during a program operation, the page buffer 340 may apply a bit line voltage corresponding to data to be programmed, to the selected bit line. During a read operation, the page buffer 340 may sense current or a voltage of the selected bit line BL and sense data stored in the memory cell.

The voltage generator 350 may generate various kinds of voltages for program, read, and erase operations based on the voltage control signal CTRL_vol. For example, the voltage generator 350 may generate a program voltage, a read voltage, a program verification voltage, and an erase voltage as a word line voltage VWL.

The row decoder 360 may select one of a plurality of word lines WL and select one of a plurality of string selection lines SSL in response to the row address X-ADDR. For example, the row decoder 360 may apply the program voltage and the program verification voltage to the selected word line WL during a program operation and apply the read voltage to the selected word line WL during a read operation.

Figure 5:
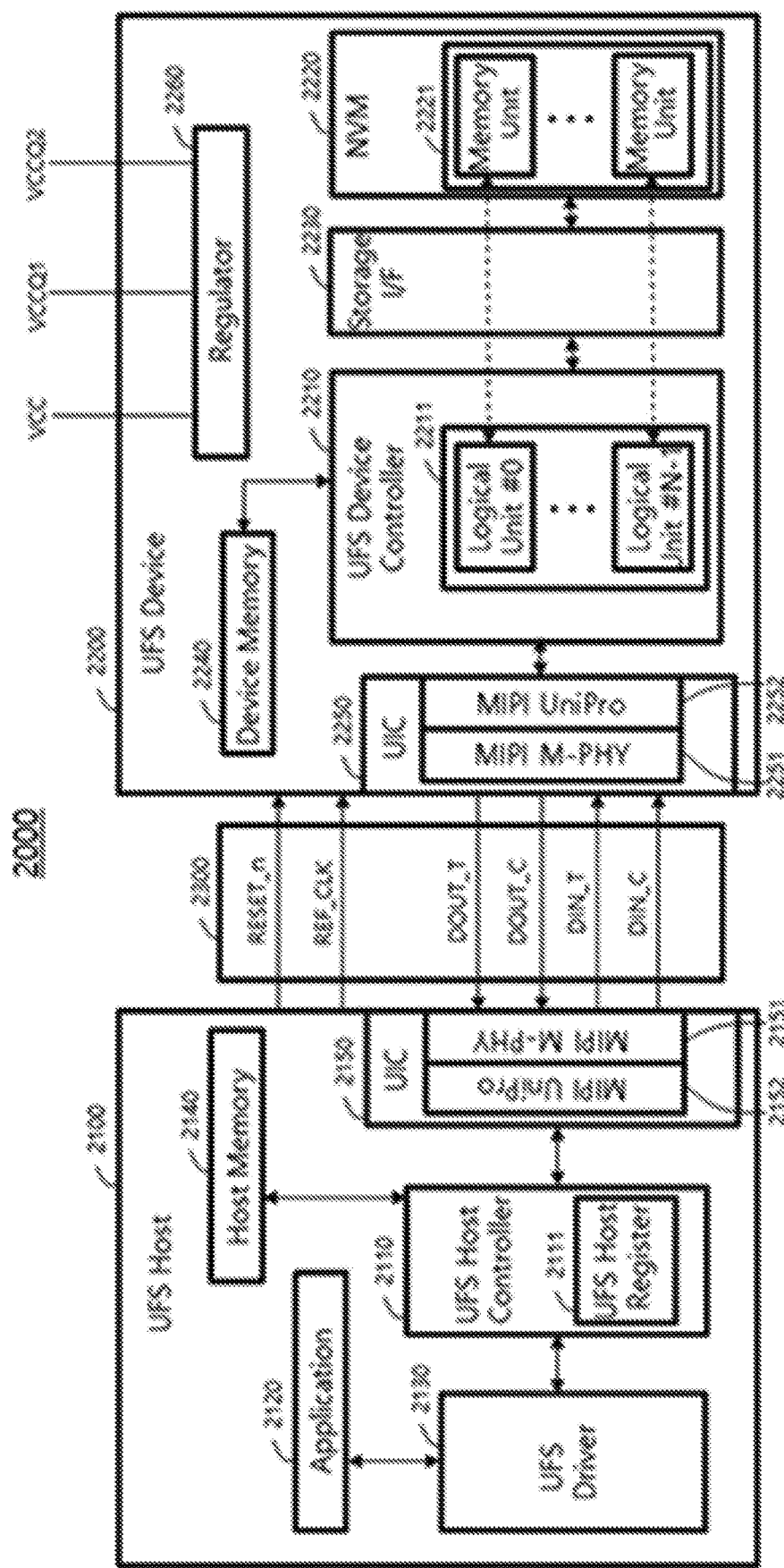
FIG. 5 is a block diagram of a UFS system, according to embodiments.

FIG. 5 is a diagram of a UFS system 2000 according to embodiments. The UFS system 2000 may be a system conforming to a UFS standard announced by Joint Electron Device Engineering Council (JEDEC) and include a UFS host 2100, a UFS device 2200, and a UFS interface 2300. The above description of the system 1000 of FIG. 1 may also be applied to the UFS system 2000 of FIG. 5 within a range that does not conflict with the following description of FIG. 5.

Referring to FIG. 5, the UFS host 2100 may be connected to the UFS device 2200 through the UFS interface 2300. When the main processor 1100 of FIG. 1 is an AP, the UFS host 2100 may be implemented as a portion of the AP. The UFS host controller 2110 and the host memory 2140 may respectively correspond to the controller 1120 of the main processor 1100 and the memories 1200a and 1200b of FIG. 1. The UFS device 2200 may correspond to the storage device 1300a and 1300b of FIG. 1, and a UFS device controller 2210 and an NVM 2220 may respectively correspond to the storage controllers 1310a and 1310b and the NVMs 1320a and 1320b of FIG. 1.

The UFS host 2100 may include a UFS host controller 2110, an application 2120, a UFS driver 2130, a host memory 2140, and a UFS interconnect (UIC) layer 2150. The UFS device 2200 may include the UFS device controller 2210, the NVM 2220, a storage interface 2230, a device memory 2240, a UIC layer 2250, and a regulator 2260. The NVM 2220 may include a plurality of memory units 2221. Although each of the memory units 2221 may include a V-NAND flash memory having a 2D structure or a 3D structure, each of the memory units 2221 may include another kind of NVM, such as PRAM and/or RRAM. The UFS device controller 2210 may be connected to the NVM 2220 through the storage interface 2230. The storage interface 2230 may be configured to comply with a standard protocol, such as Toggle or ONFI.

The application 2120 may refer to a program that wants to communicate with the UFS device 2200 to use functions of the UFS device 2200. The application 2120 may transmit input-output requests (IORs) to the UFS driver 2130 for input/output (I/O) operations on the UFS device 2200. The IORs may refer to a data read request, a data storage (or write) request, and/or a data erase (or discard) request, without being limited thereto.

The UFS driver 2130 may manage the UFS host controller 2110 through a UFS-host controller interface (UFS-HCI). The UFS driver 2130 may convert the IOR generated by the application 2120 into a UFS command defined by the UFS standard and transmit the UFS command to the UFS host controller 2110. One IOR may be converted into a plurality of UFS commands. Although the UFS command may basically be defined by an SCSI standard, the UFS command may be a command dedicated to the UFS standard.

The UFS host controller 2110 may transmit the UFS command converted by the UFS driver 2130 to the UIC layer 2250 of the UFS device 2200 through the UIC layer 2150 and the UFS interface 2300. During the transmission of the UFS command, a UFS host register 2111 of the UFS host controller 2110 may serve as a command queue (CQ).

The UIC layer 2150 on the side of the UFS host 2100 may include a mobile industry processor interface (MIPI) M-PHY 2151 and an MIPI UniPro 2152, and the UIC layer 2250 on the side of the UFS device 2200 may also include an MIPI M-PHY 2251 and an MIPI UniPro 2252.

The UFS interface 2300 may include a line configured to transmit a reference clock signal REF_CLK, a line configured to transmit a hardware reset signal RESET_n for the UFS device 2200, a pair of lines configured to transmit a pair of differential input signals DIN_t and DIN_c, and a pair of lines configured to transmit a pair of differential output signals DOUT_t and DOUT_c.

A frequency of a reference clock signal REF_CLK provided from the UFS host 2100 to the UFS device 2200 may be one of 19.2 MHz, 26 MHz, 38.4 MHz, and 52 MHz, without being limited thereto. The UFS host 2100 may change the frequency of the reference clock signal REF_CLK during an operation, that is, during data transmission/receiving operations between the UFS host 2100 and the UFS device 2200. The UFS device 2200 may generate cock signals having various frequencies from the reference clock signal REF_CLK provided from the UFS host 2100, by using a phase-locked loop (PLL). Also, the UFS host 2100 may set a data rate between the UFS host 2100 and the UFS device 2200 by using the frequency of the reference clock signal REF_CLK. That is, the data rate may be determined depending on the frequency of the reference clock signal REF_CLK.

The UFS interface 2300 may support a plurality of lanes, each of which may be implemented as a pair of differential lines. For example, the UFS interface 2300 may include at least one receiving lane and at least one transmission lane. In FIG. 5, a pair of lines configured to transmit a pair of differential input signals DIN_T and DIN_C may constitute a receiving lane, and a pair of lines configured to transmit a pair of differential output signals DOUT_T and DOUT_C may constitute a transmission lane. Although one transmission lane and one receiving lane are illustrated in FIG. 5, the number of transmission lanes and the number of receiving lanes may be changed.

The receiving lane and the transmission lane may transmit data based on a serial communication scheme. Full-duplex communications between the UFS host 2100 and the UFS device 2200 may be enabled due to a structure in which the receiving lane is separated from the transmission lane. That is, while receiving data from the UFS host 2100 through the receiving lane, the UFS device 2200 may transmit data to the UFS host 2100 through the transmission lane. In addition, control data (e.g., a command) from the UFS host 2100 to the UFS device 2200 and user data to be stored in or read from the NVM 2220 of the UFS device 2200 by the UFS host 2100 may be transmitted through the same lane. Accordingly, between the UFS host 2100 and the UFS device 2200, there may be no need to further provide a separate lane for data transmission in addition to a pair of receiving lanes and a pair of transmission lanes.

The UFS device controller 2210 of the UFS device 2200 may control all operations of the UFS device 2200. The UFS device controller 2210 may manage the NVM 2220 by using a logical unit (LU) 2211, which is a logical data storage unit. The number of LUs 2211 may be 8, without being limited thereto. The UFS device controller 2210 may include an FTL and convert a logical data address (e.g., a logical block address (LBA)) received from the UFS host 2100 into a physical data address (e.g., a physical block address (PBA)) by using address mapping information of the FTL. A logical block configured to store user data in the UFS system 2000 may have a size in a predetermined range. For example, a minimum size of the logical block may be set to 4 Kbyte.

When a command from the UFS host 2100 is applied through the UIC layer 2250 to the UFS device 2200, the UFS device controller 2210 may perform an operation in response to the command and transmit a completion response to the UFS host 2100 when the operation is completed.

As an example, when the UFS host 2100 intends to store user data in the UFS device 2200, the UFS host 2100 may transmit a data storage command to the UFS device 2200. When a response (a 'ready-to-transfer' response) indicating that the UFS host 2100 is ready to receive user data (ready-to-transfer) is received from the UFS device 2200, the UFS host 2100 may transmit user data to the UFS device 2200. The UFS device controller 2210 may temporarily store the received user data in the device memory 2240 and store the user data, which is temporarily stored in the device memory 2240, at a selected position of the NVM 2220 based on the address mapping information of the FTL.

As another example, when the UFS host 2100 intends to read the user data stored in the UFS device 2200, the UFS host 2100 may transmit a data read command to the UFS device 2200. The UFS device controller 2210, which has received the command, may read the user data from the NVM 2220 based on the data read command and temporarily store the read user data in the device memory 2240. During the read operation, the UFS device controller 2210 may detect and correct an error in the read user data by using an ECC engine embedded therein. More specifically, the ECC engine may generate parity bits for write data to be written to the NVM 2220, and the generated parity bits may be stored in the NVM 2220 along with the write data. During the reading of data from the NVM 2220, the ECC engine may correct an error in read data by using the parity bits read from the NVM 2220 along with the read data, and output error-corrected read data.

In addition, the UFS device controller 2210 may transmit user data, which is temporarily stored in the device memory 2240, to the UFS host 2100. In addition, the UFS device controller 2210 may further include an AES engine. The AES engine may perform at least of an encryption operation and a decryption operation on data transmitted to the UFS device controller 2210 by using a symmetric-key algorithm.

The UFS host 2100 may sequentially store commands, which are to be transmitted to the UFS device 2200, in the UFS host register 2111, which may serve as a common queue, and sequentially transmit the commands to the UFS device 2200. In this case, even while a previously transmitted command is still being processed by the UFS device 2200, that is, even before receiving a notification that the previously transmitted command has been processed by the UFS device 2200, the UFS host 2100 may transmit a next command, which is on standby in the CQ, to the UFS device 2200. Thus, the UFS device 2200 may also receive a next command from the UFS host 2100 during the processing of the previously transmitted command. A maximum number (or queue depth) of commands that may be stored in the CQ may be, for example, 32. Also, the CQ may be implemented as a circular queue in which a start and an end of a command line stored in a queue are indicated by a head pointer and a tail pointer.

Each of the plurality of memory units 2221 may include a memory cell array and a control circuit configured to control an operation of the memory cell array. The memory cell array may include a 2D memory cell array or a 3D memory cell array. The memory cell array may include a plurality of memory cells. Although each of the memory cells is a single-level cell (SLC) configured to store 1-bit information, each of the memory cells may be a cell configured to store information of 2 bits or more, such as a multi-level cell (MLC), a triple-level cell (TLC), and a quadruple-level cell (QLC). The 3D memory cell array may include a vertical NAND string in which at least one memory cell is vertically oriented and located on another memory cell.

Voltages VCC, VCCQ, and VCCQ2 may be applied as power supply voltages to the UFS device 2200. The voltage VCC may be a main power supply voltage for the UFS device 2200 and be in a range of 2.4 V to 3.6 V. The voltage VCCQ may be a power supply voltage for supplying a low voltage mainly to the UFS device controller 2210 and be in a range of 1.14 V to 1.26 V. The voltage VCCQ2 may be a power supply voltage for supplying a voltage, which is lower than the voltage VCC and higher than the voltage VCCQ, mainly to an I/O interface, such as the MIPI M-PHY 2251, and be in a range of 1.7 V to 1.95 V. The power supply voltages may be supplied through the regulator 2260 to respective components of the UFS device 2200. The regulator 2260 may be implemented as a set of unit regulators respectively connected to different ones of the power supply voltages described above.

As discussed above, embodiments may relate to efficient BCH decoding with low error correcting capability, which may correct t and (t+1) errors in polar codewords. As discussed above, an error correcting capability of t=2 may be used, however embodiments are not limited thereto. In embodiments, at least some polar codewords from among a plurality of polar codewords, which may be stored for example in a storage device, may be decoded using BCH decoders and not polar decoders, and therefore an overall throughput may be increased. In some embodiments, one or more polar parity may be used for checking or validating the polar frames, and for performing smart chase decoding, examples of which are discussed in greater detail below.

Figure 6:
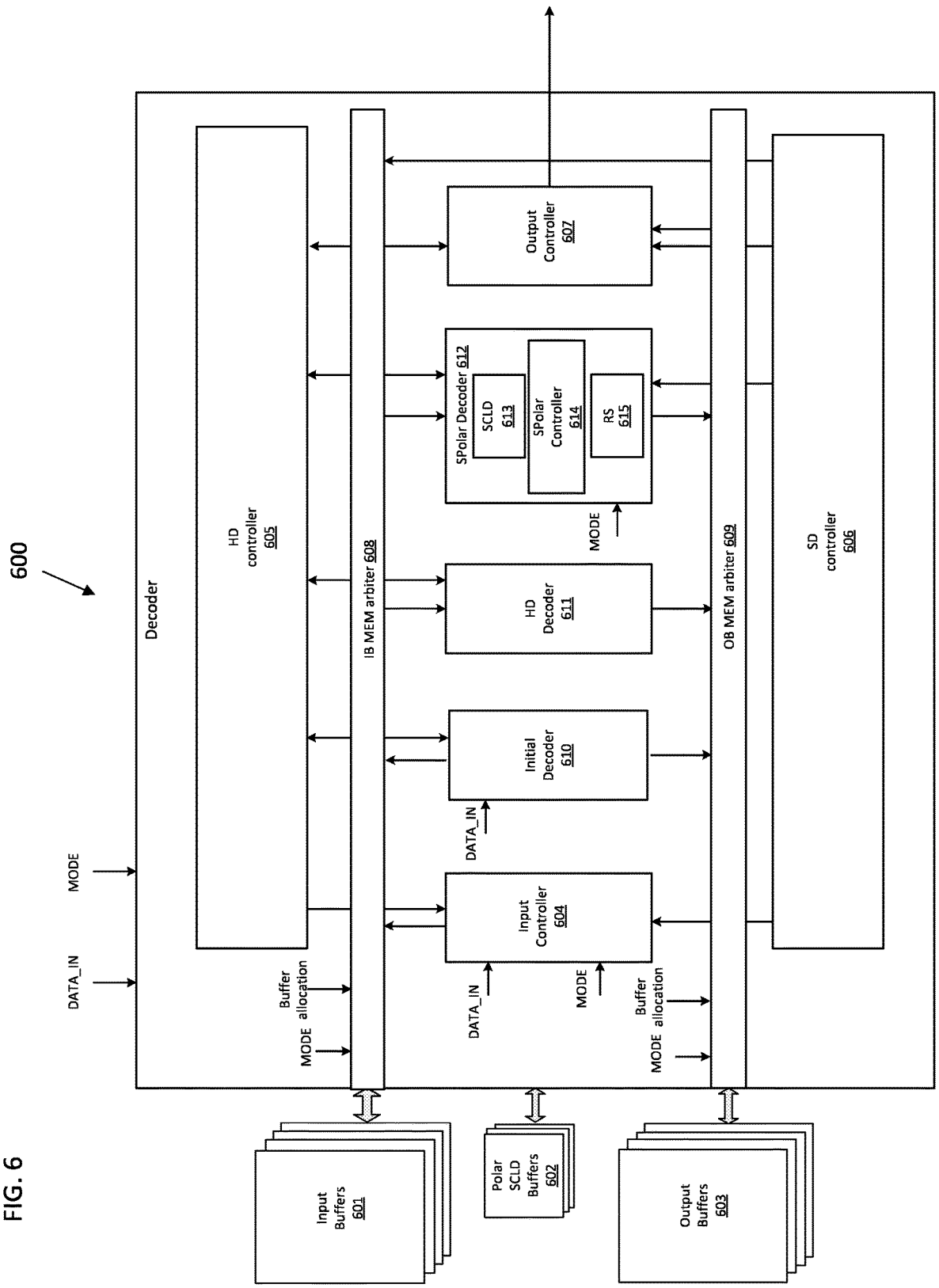
FIG. 6 is a block diagram of a decoder, according to embodiments.

FIG. 6 is a block diagram of a decoder, according to embodiments. The decoder 600 may correspond to any of the elements described above. In embodiments, the decoder 600 may use an input controller 604 and an inbound (IB) memory arbiter 608 to obtain a plurality of input codewords from a plurality of input buffers 601. The input codewords may be encoded using a GCC code, for example an SPolar GCC code, and may be obtained from a storage device. The decoder 600 may decode and correct the input codewords using ECC coding to obtain output codewords, and may use the output controller 607 and an outbound (OB) memory arbiter 609 to provide the output codeword to a plurality of output buffer 603.

As shown in FIG. 6, the decoder 600 may include an SPolar decoder 612, which may perform decoding such as ECC decoding of an SPolar GCC codeword. The SPolar controller 614 may control the SPolar decoder 612 to decode an outer code of the SPolar GCC codeword using a successive cancelation list decoder (SCLD) 613, and to decode an inner code of the SPolar GCC codeword using a Reed-Solomon (RS) decoder 615. In embodiments, the outer code may be a polar code, and may correspond to rows or frames of the SPolar GCC codeword.

The decoder 600 may perform hard decision (HD) decoding, which may be controlled using an HD controller 605, and soft decision (SD) decoding, which may be controlled by an SD controller 606. In embodiments, the SCLD 613 may have latency of O(NlogN), which may cause a throughput challenge in HD decoding, where the expected noise may be low and the expected throughput may be relatively high with respect to the input rate. Accordingly, the decoder 600 may use an initial decoder 610 to perform a first phase or stage of HD decoding based directly on input frames without activating the SPolar decoder 612. In embodiments, the next stages in the HD decoding may be super BCH (SBCH) decoding using an SBCH decoder 611, and SPolar decoding using the SPolar decoder 612. In embodiments, one or more of these stages may be pipelined.

The initial decoder 610 may perform an initial decoding of frames as they are received in order accelerate HD decoding throughput by reducing the number of failing frames for the next stages. For example, the initial decoder 610 may be activated by the HD controller 605 while the decoder 600 operates in an HD mode, and may be capable of decoding at least some of the input frames, for example approximately 50% of the input frames. Table 1 below shows the probability of various numbers of errors which may be encountered in a 512-bit frame by the decoder operating in the HD mode at a residual bit error rate (RBER) of =7e-3.

TABLE 1

| Number of Errors | Probability |
| --- | --- |
| 0 | 0.027 |
| 1 | 0.099 |
| 2 | 0.178 |
| 3 | 0.213 |
| >3 | 1 − 0.518 = 0.482 |

As discussed above, the initial decoder 610 may receive frames or codewords which satisfy the requirements of BCH codes and polar codes. However, in general, polar frames may have $2^m$ bits, and BCH frames may have $2^m-1$ bits, where m is an integer. Therefore, a frame 700 which may be used as an input to the initial decoder 610 may be referred to as an extended BCH frame. In embodiments, a BCH frame corresponding to the frame 700 may include the information bits i and parity bits p*, and a polar frame corresponding to the frame 700 may include all of the bits of the BCH frame and also an additional parity bit p'.

Figure 7:
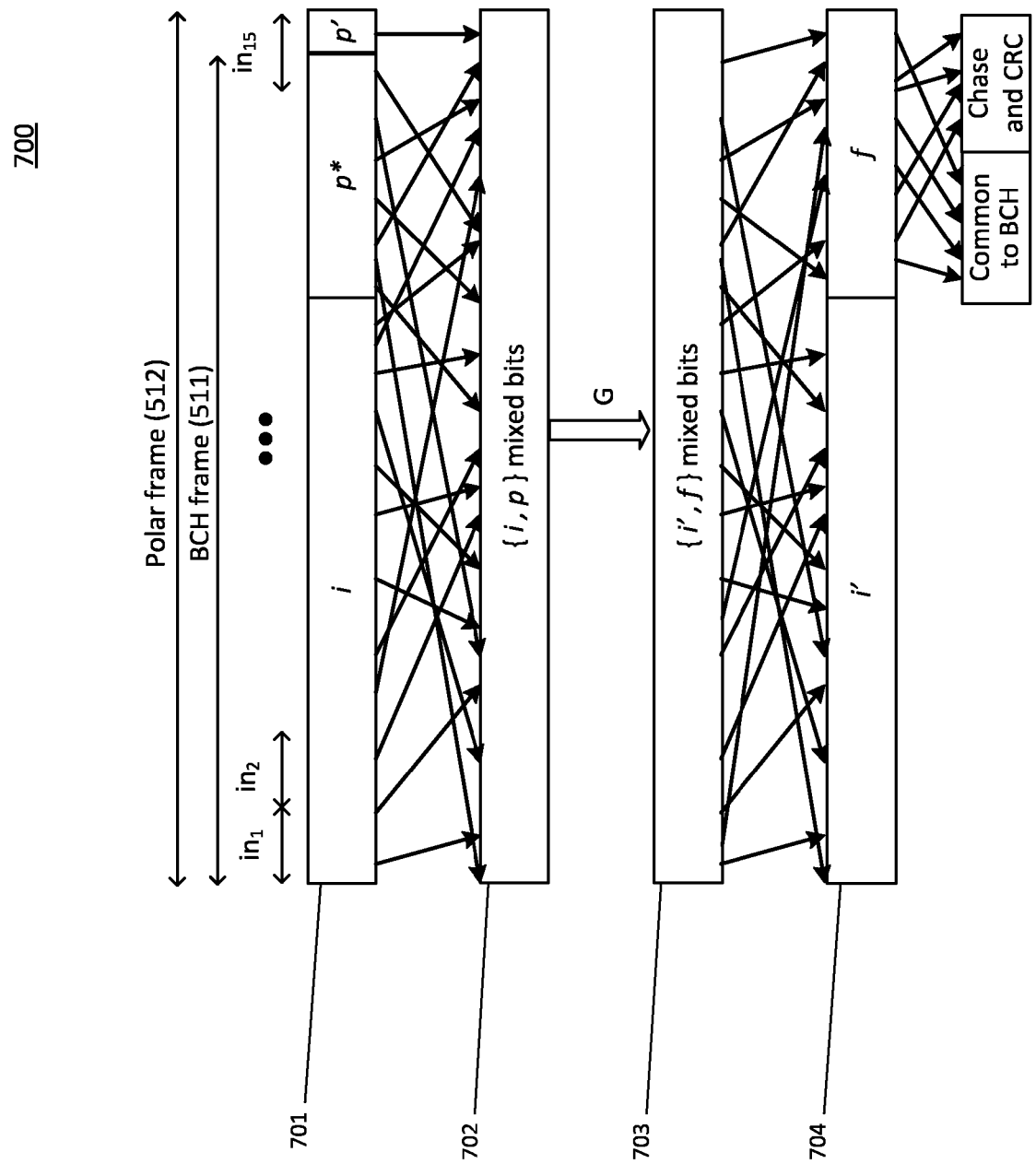
FIG. 7 is a block diagram illustrating representations of a codeword frame, according to embodiments.

For example, as shown in FIG. 7, the frame 700 may correspond to both a polar frame having 512 bits and a BCH frame having 511 bits, however embodiments are not limited thereto. The frame 700 may be received by at least one of the decoder 600 and the initial decoder 610 in a plurality of chunks, each of which may correspond to a clock cycle. For example, as shown in FIG. 7, the frame 700 may be received in chunks $in_1, in_2, \ldots, in_{15}$, however embodiments are not limited thereto.

In embodiments, the additional parity bit p', may be a parity bit which indicates a parity of all bits of the frame 700. Therefore, the initial decoder 610 may not decode the additional parity bit p' using BCH decoding, and may instead use the parity bit p' to perform a check or validation of the frame 700 after it is decoded.

In embodiments, the parity bits p* may be used to satisfy BCH code constraints, for example syndromes and delta syndromes, as well as and polar code constraints, for example static frozen bits and delta-frozen bits. Some parity bits are common to both BCH and polar codes, and some are unique. Parity bits for Polar code and BCH code of a certain stage may have different locations, and some frozen bits may be defined "dynamic" according to BCH constraints.

The frame 700 may have different representations, according to the operation being performed by the initial decoder 610. For example, when the frame 700 is received by at least one of the decoder 600 and the initial decoder 610, it may be organized in BCH order, an example of which is shown as representation 701. The representation 701 may be useful for BCH decoding operations, for example on-the-fly syndrome calculation. The frame 700 may then be reordered into an information-side polar representation, an example of which is shown as representation 702. The representation 702 may include the information bits i and parity bits p=p*+p', which may be mixed throughout the representation 702. The frame 700 may then be multiplied by the a polar code generating matrix G to obtain a frozen-side polar representation, an example of which is shown as representation 703. The representation 703 may be used by the SPolar decoder 612, and may include information bits i' and frozen bits f, which may be mixed throughout the representation 702. In embodiments, the information bits i and the information bits i' may not be identical, and instead may be related. If the frame 700 is successfully decoded, it may be rearranged to a representation 704 by separating the frozen bits f from the information bits i' before being output to the next stage, in order to facilitate efficient RS decoding. In embodiments, the BCH syndromes may be for example 9 bits each, however embodiments are not limited thereto. In embodiments, some of the frozen bits f may be related to BCH syndromes, and the rest may be used for check operations, for example cyclic redundancy check (CRC).

Table 2 below provides examples of bit locations for frozen bits and dynamic frozen bits for a frame of 512 bits, however embodiments are not limited thereto.

TABLE 2

| Frozen | Dynamic Frozen |
|---|---|
| 0, 1, 2, 4, 8, 16, 32, 3, 5, 6, 9, 64, 10, 17, 12, 18, 128, 256, 20, 33, 34, 7, 24, 36, 65, 11, 66, 13 | 257 258 260 264 272 288 320 384 192, 129 130 |

In an example frame corresponding to Table 2, the frozen bits that may be used for CRC check may be 3, 5, 6, 9, 10, 17, 12, 18, 20, 7, 11, 13, 129, 130, 33, 34, 24, 36, 65, 66. In embodiments, the other bits may be common for BCH and polar representations, with no conditional encoding. Accordingly, these other bits may be referred to as dynamic bits.

Figure 8A:
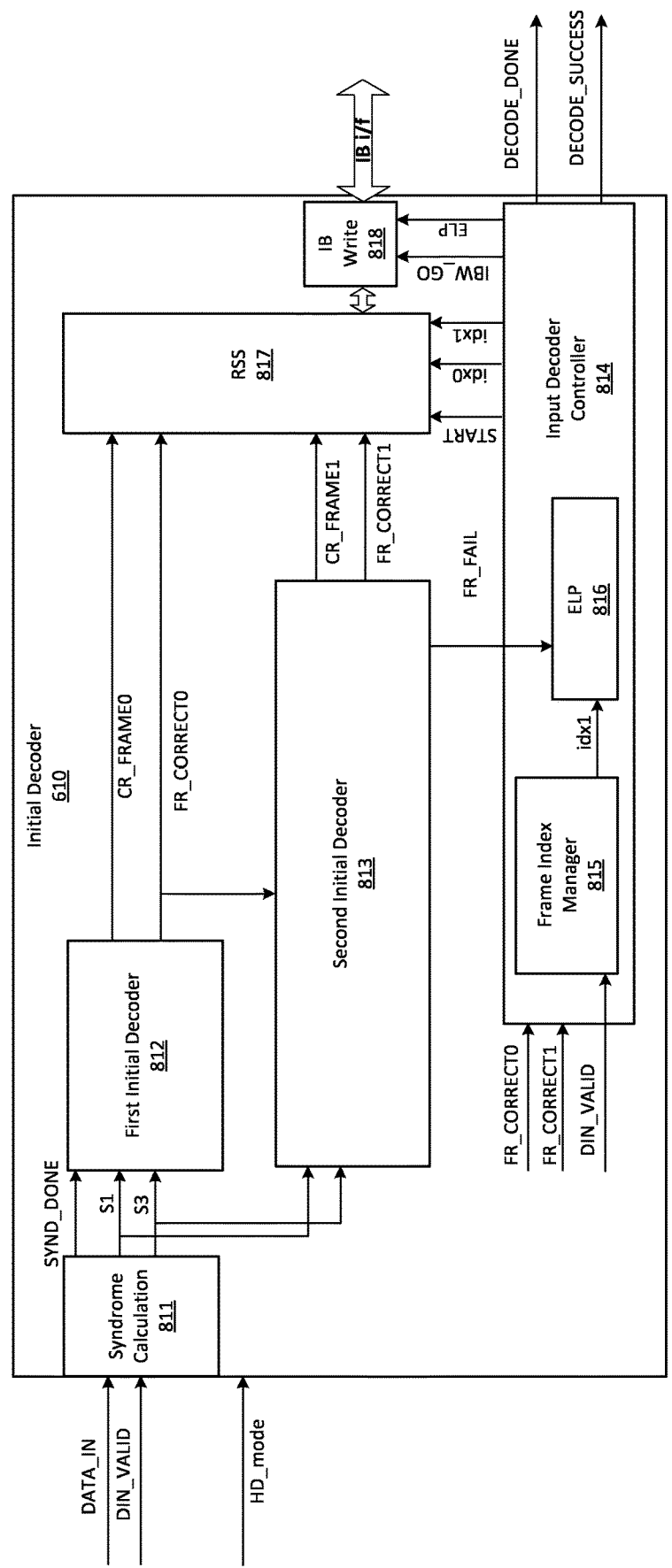
FIG. 8A is a block diagram of an initial decoder, according to embodiments.

FIG. 8A is a block diagram of an initial decoder, according to embodiments. As shown in FIG. 8A, the initial decoder 610 may receive input frames using for example a signal DATA_IN, and may receive a signal DIN_VALID indicating whether the input frames are valid, and a signal HD_MODE which may indicate whether the decoder 600 is operating in an HD mode. The initial decoder 610 may include a syndrome calculation module 811, which may receive input frames, using for example signal DATA_IN, and may generate syndromes, for example syndrome S1 and syndrome S3, and a signal SYND_DONE indicating that the syndrome calculation is finished. The initial decoder 610 may further include a first initial decoder 812, which may receive the syndromes and the signal SYND_DONE, and may generate an output frame FRAME0, as well as a signal FR_CORRECT0, which may indicate whether the output frame FRAME0 is valid. In embodiments, the output frame FRAME0 may be arranged according to representation 704. The initial decoder 610 may further include a second initial decoder 813, which may receive the syndromes and the signal FR_CORRECT0, and may generate an output frame FRAME1, as well as a signal FR_CORRECT1, which may indicate whether the output frame FRAME1 is valid, and a signal FR_FAIL, which may indicate whether the frame correction performed by the first initial decoder 812 and the second initial decoder 813 failed.

As shown in FIG. 8A, the initial decoder 610 may further include an initial decoder controller 814, which may receive the signals FR_CORRECT0, FR_CORRECT1, FR_FAIL, and DIN_VALID. The initial decoder controller 814 may include a frame index manager 815 which may assist in managing an error locator polynomial (ELP) which may be used for later decoding stages, and which may be stored in an ELP module 816. The initial decoder controller 814 may control operations of an RSS module 817, which may receive and store one or more of the output frame FRAME0 and the output frame FRAME1 based on a signal START and signals idx0 and idx1 generated by the initial decoder controller 814. The initial decoder controller 814 may control operations of an input buffer (IB) write module 818, which may receive and store one or more coefficients of the ELP and information from the RSS module 817 based on a signal IBW_GO.

In embodiments, the initial decoder 610 may update RS syndromes stored in the RSS module 817 and the ELP coefficients stored in the ELP module 816 to reflect the status of decode, for example corrected frames and their frozen bits. When the last frame of a GCC codeword is decoded and the RS syndromes and the ELP are updated, they may be written from the IB write module 818 to an input buffer for subsequent decoding stage. The RS syndromes and the ELP may be used and maintained in subsequent decoding stages for performing GCC decoding, for example by the SBCH decoder 611 and the SPolar decoder 612.

In embodiments, both RS syndrome and ELP updates may be completed in 16 cycles per frame in order to support throughput, and logic included in the initial decoder 610 may either allow a new update in pipeline, or maintain a first-in-first-out (FIFO) buffer which may be relatively small, for example having a depth of 2, because the gap between updates may sometimes be less than 16 cycles. In embodiments, RS syndrome update may be performed using dynamic delta frozen values, and not directly with the frozen bits.

Embodiments may support out-of-order syndrome and ELP updates, because the gap between successful frames is not constant, and a frame that is successfully decoded by the first initial decoder 812 may arrive before a previous frame that is decoded by the second initial decoder 813, and therefore takes longer to decode. An example of this is discussed below with respect to FIG. 10.

Figure 8B:
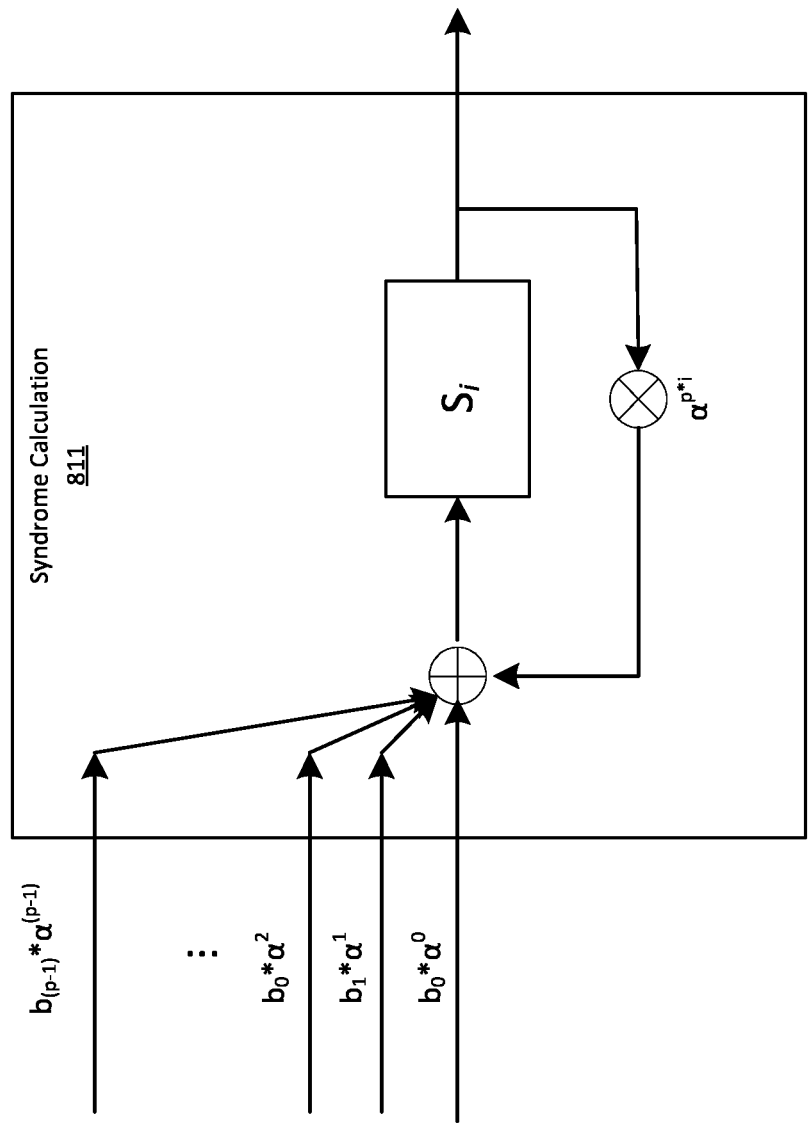
FIG. 8B is a block diagram of a syndrome calculation module, according to embodiments.

FIG. 8B is a block diagram of a syndrome calculation module, according to embodiments. The syndrome calculation module 811 may begin syndrome calculations as a frame is input. In embodiments, as shown in FIG. 8B, the syndrome calculation module 811 may be calculated on-the-fly using Horner rule hardware with parallelism according to input width. For example, the hardware of the syndrome calculation module 811 may operate using a 32-bit parallelism, however embodiments are not limited thereto. As shown in FIG. 8B, for each syndrome Si, (i=1,3, . . . , (2t−1)), the syndrome value may be the evaluation of the input polynomial in $\alpha^i$. For example, in order to calculate syndrome with parallelism of 32 bits per cycle, there may be 32 input bits multiplied by constants $\alpha^{31}$ . . . $\alpha^0$ (in an order of most significant bit to least significant bit), and the feedback may be multiplied by $\alpha^{32*i}$.

Figure 8C:
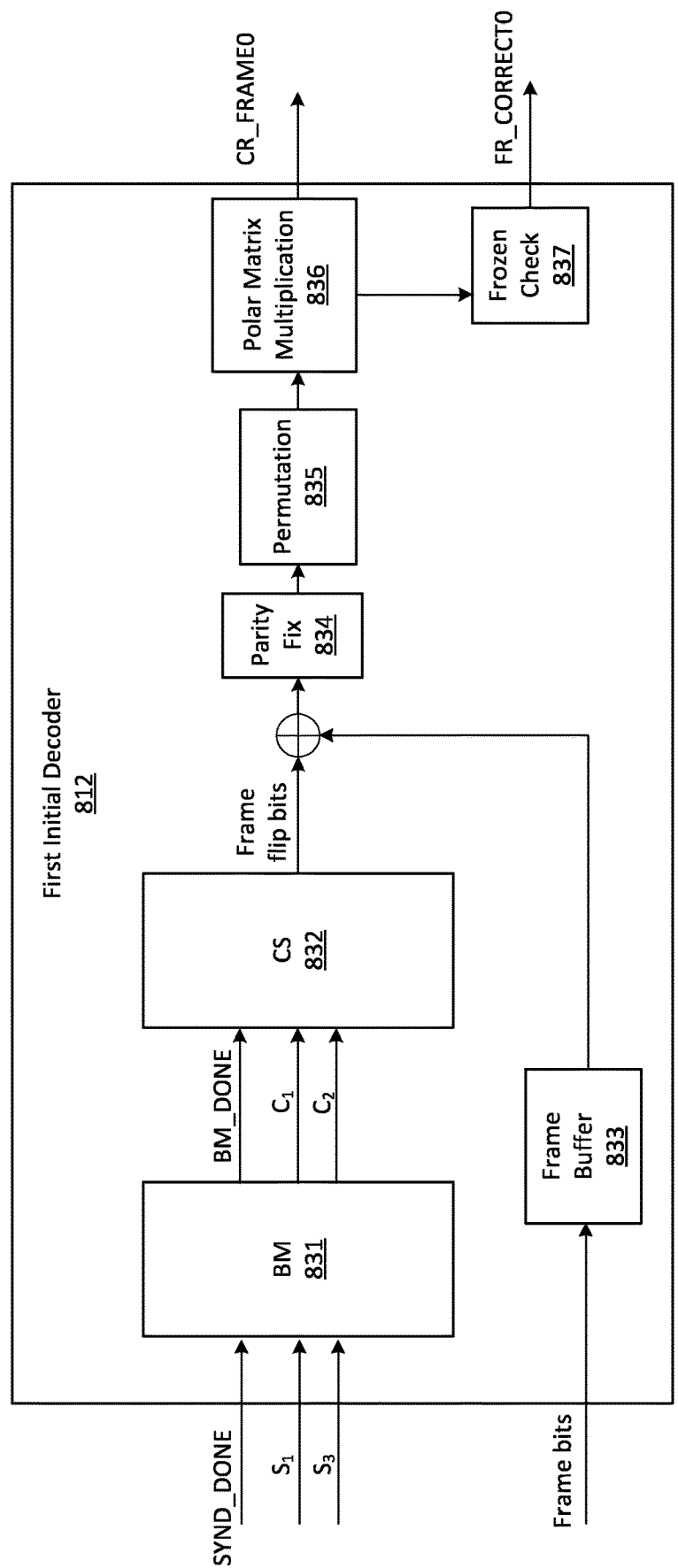
FIG. 8C is a block diagram of a first initial decoder, according to embodiments.

FIG. 8C is a block diagram of a first initial decoder, according to embodiments. The first initial decoder 812 may receive the syndromes calculated by the syndrome calculation module 811, and may perform BCH decoding with an error correction capability of t. As shown in FIG. 8C, the first initial decoder 812 may include a Berlekamp-Massey (BM) module 831 which may receive the syndromes, for example the syndromes S1 and S3, and may perform a BM calculation to generate coefficients of an ELP polynomial, for example the coefficients C1 and C2, as well as a signal BM_DONE indicating that the BM algorithm is finished.

In embodiments, the first initial decoder 812 may perform the BCH decoding with an error correction capability of t=2. Therefore, because only two iterations are being handled, the BM calculation may be relatively simple, and may be reached by direct calculation of all options for the first two iterations, considering that there may be zero, one, or two errors. In embodiments, the discrepancy Δ3 of the second iteration may be determined according to Equation 1 below:

$$\Delta_3 = S1^3 + S3 \quad \text{Equation 1}$$

Accordingly, based on the error correcting capability of t=2, the options for output of the BM module 831 after two iterations are provided in Table 3 below:

TABLE 3

| Conditions | Number of Errors | ELP coefficients | ELP degree | Comments |
|---|---|---|---|---|
| $S_1! = 0$ && $\Delta_3! = 0$ | 2 | $1 + S_1X + (\Delta_3/S_1)X^2$ | 2 | Next stage is "fast CS" calculation for 2 errors |
| $S_1! = 0$ && $\Delta_3 = 0$ | 1 | $1 + S_1X$ | 1 | Next stage is "fast CS" calculation for 1 error |
| $S_1 = 0$ && $S_3! = 0$ | >2 | 0 | — | The conditions indicate more than two errors in the frame. Therefore, the CS stage is not applied, and the BCH decoding fails |
| $S_1 =$ $S_3 = 0$ | 0 | 1 | 0 | CS stage can be skipped |

As further shown in FIG. 8C, the first initial decoder 812 may include a Chien search (CS) module 832, which may receive the coefficients obtained by the BM module 831, and may perform a CS calculation to determine up to t error bits to be flipped in order to correct the input frame.

In embodiments, based on the first initial decoder performing the BCH decoding with an error correction capability of t=2, the CS calculation may be performed by iterative CS hardware, or with a more simple calculation, according to the ELP degree.

For example, for an ELP degree of 1, the ELP may have a single solution provided by Equation 2 below:

$$1 + S_1X = 0 \quad \text{Equation 2}$$

The root of Equation 2 may be obtained as 1/S1. Therefore, a divider may be implemented in hardware, for example using a multiplexer. For an ELP degree of 2, the ELP may be represented according to Equation 3 below:

$$ELP(x) = a_2 \cdot x^2 + a_1 \cdot x + 1, a_1 \neq 0, a_2 \neq 0 \quad \text{Equation 3}$$

Accordingly, ELP roots can be calculated in several different ways, for example using a parallel polynomial evaluation, a table, or using a matrix calculation, an example of which is discussed below.

According to embodiments, the roots of a polynomial having a degree of 2 with coefficients over the Galois field may be found using an m×m matrix A which may be pre-calculated for the field. For example, for GF ($2^m$) used by BCH, (m=9), with primitive polynomial $1+x^4+x^9$, the matrix A may be provided by Equation 4 below:

$$A = \begin{matrix} 0 & 0 & 1 & 0 & 1 & 1 & 0 & 0 & 1 \\ 0 & 0 & 0 & 1 & 1 & 1 & 1 & 0 & 1 \\ 0 & 0 & 0 & 0 & 0 & 1 & 1 & 1 & 0 \\ 0 & 0 & 0 & 1 & 0 & 0 & 1 & 0 & 1 \\ 0 & 1 & 1 & 0 & 1 & 1 & 0 & 0 & 1 \\ 0 & 0 & 0 & 1 & 0 & 1 & 1 & 1 & 0 \\ 0 & 0 & 0 & 0 & 0 & 1 & 0 & 0 & 0 \\ 0 & 0 & 0 & 1 & 0 & 0 & 1 & 0 & 0 \\ 1 & 0 & 0 & 0 & 0 & 1 & 0 & 0 & 0 \end{matrix} \quad \text{Equation 4}$$

Temporary variables b, c, d1, d, which may be elements in GF ($2^9$), may be calculated according to Equation 5 and Equation 6 below:

$$c = 1/a2; b = a1 * c \quad \text{Equation 5}$$

$$d1 = 1/(a1^2); d = a2 * d1 \quad \text{Equation 6}$$

A vector y of m bits may be defined according to Equation 7 below:

$$y = A * d \quad \text{Equation 7}$$

If the MSB of y ($y_{m-1}$) is not 0, this may indicate a failure. Otherwise, the vector y may be left-shifted to the vector $y_{new}$ as shown in Equation 8 below:

$$y_{new}(0, y_0, y_1, \ldots, y_{m-2}) \quad \text{Equation 8}$$

Then, the roots of the ELP may be determined according to Equation 9 and Equation 10 below:

$$\text{root1} = b * y \quad \text{Equation 9}$$

$$\text{root2} = \text{root1} + b \quad \text{Equation 10}$$

As further shown in FIG. 8C, the first initial decoder 812 may include a frame buffer 833 which may provide the bits of the frame to be flipped, and a parity fix module 834 which may perform a parity check based on the additional parity bit p' after the error bits are flipped. The first initial decoder 812 may include a permutation module 835 which may permutate the frame to an information-side polar code arrangement such as representation 702, and a polar matrix multiplication module 836 which may multiply the frame by the polar generator matrix G to obtain a frozen-side polar code arrangement such as representation 703, which may be output as the output frame FRAME0. The first initial decoder 812 may include a frozen check module 837 which may check the frozen bits of the frame to determine whether the frame is a valid polar frame, and then output the signal FR_CORRECT0. For example, frozen check module 837 may output the signal FR_CORRECT0 indicating that the output frame FRAME0 is valid based on all of the frozen bits being equal to zero.

Figure 8D:
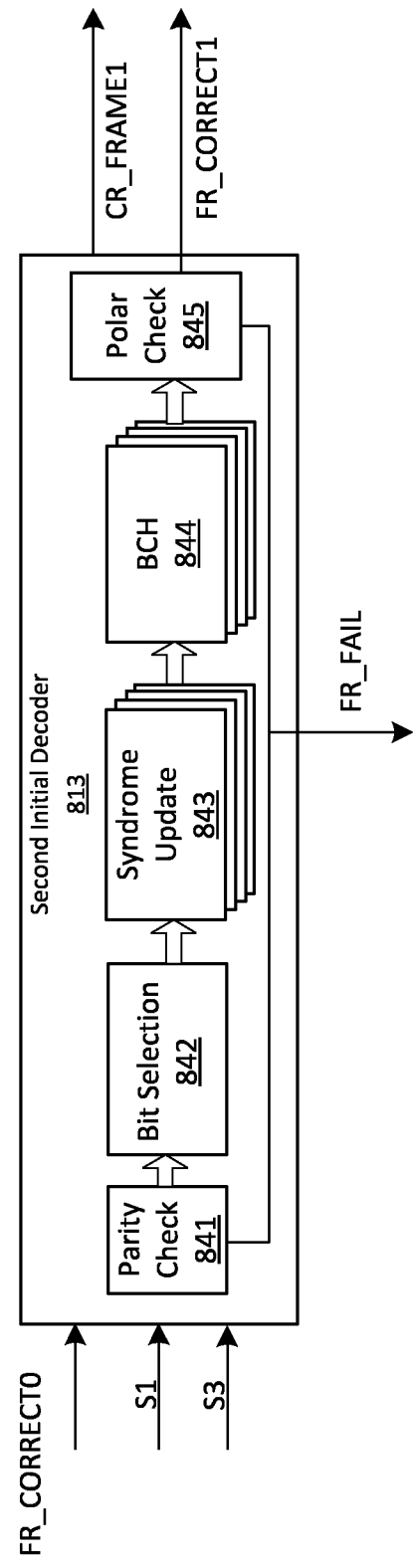
FIG. 8D is a block diagram of a second initial decoder, according to embodiments.

FIG. 8D is a block diagram of a second initial decoder, according to embodiments. If the frame was not successfully corrected by the first initial decoder 812, the initial decoder 610 may activate the second initial decoder 813 to perform a smart chase decoding operation.

As shown in FIG. 8D, in embodiments the second initial decoder 813 may include a parity check module 841 which may perform a parity check based on the additional parity bit p' before the smart chase decoding operation is performed. For example, based on the parity check indicating that the number of errors is even, this may indicate that the only possibility to find three errors in the frame is when the parity bit is also flipped. Accordingly, it may be beneficial to declare the frame a failure and skip the smart chase decoding operation, in order to avoid potential miscorrection of the frame. If the parity check is 1, which may mean that the number of errors or flipped bits is odd, the second initial decoder may proceed to attempt to correct exactly three errors.

According to the smart chase decoding operation, the second initial decoder 813 may attempt to determine whether exactly t+1 errors are present in the frame. If so, the frame may be corrected without performing polar decoding. However, if the smart chase decoding operation indicates that any number of errors other than exactly t+1 errors are present, this may indicate that the frame is not correctable by the initial decoder 610. For example, if the smart chase decoding operation indicates that less than t+1 errors are present, this may indicate that the solution is not valid, because less than t+1 errors should have been corrected by the first initial decoder 812 before reaching the second initial decoder 813. In addition, if more than t+1 errors are present, this may indicate that polar decoding is required to properly correct all of the errors.

For example, in embodiments the second initial decoder 813 may attempt to correct exactly three errors, by guessing the first erroneous bit ("chase") and finding the other two errors using a BCH decoder having an error correction capability of exactly t=2, which may be expressed as t==2.

As shown in FIG. 8D, the second initial decoder 813 may receive the syndromes calculated by the syndrome calculation module 811, and may perform the smart chase decoding operation to determine whether the input frame has exactly t+1 errors, for example t+1=3. As shown in FIG. 8D, the second initial decoder 813 may receive the syndromes, for example the syndromes S1 and S3, and the signal FR_CORRECT0.

As shown in FIG. 8D, in order to perform the smart chase decoding operation, the second initial decoder 813 may include a bit selection module 842, which may select a potential error bit. In embodiments, the second initial decoder 813 may modify the frame by flipping the potential error bit to perform the smart chase decoding operation. The second initial decoder 813 may include one or more syndrome update modules 843, which may update the syndromes based on the modified frame, and one or more BCH modules 844, which may perform BCH decoding on the modified frame to attempt to find exactly t errors based on the updated syndromes. The second initial decoder 813 may include a polar check module 845, which may permutate frames which are successfully decoded by the one or more BCH modules 844 in order to generate information-side polar frames, which may be output as the output frame CR_FRAME1, and may multiply the frames by the polar generator matrix G to generate frozen-side polar frames. The polar check module 845 may check the frozen bits of the frame, and may output the signal FR_CORRECT1 indicating that the output frame FRAME1 is valid based on all of the frozen bits being equal to zero.

In general, guessing the first erroneous bit may be an iterative process, that may take up to $2^m-3$ trials. However, if the bit selection module 842 is able to determine a smaller range that is guaranteed to have one error, the number of bits to be evaluated in the smart chase decoding operation may be greatly reduced.

For example, suppose that 3 errors are present in a frame of 512 bits. In general, guessing the first erroneous bit may require up to 511-2 trials. However, considering the frozen bits included in the frozen-side polar frame of representation 703, each frozen bit may be connected to a list of bits in the input frame. Therefore, using the frozen bits as indicators, the chase range may be narrowed down to only 128 bits. If a range indicator, e.g. one of the frozen bits, is set to 1 instead of 0, this may mean that an odd number of its connections is flipped. In embodiments, this may mean that at least one, or possibly up to three, of the 128 connected bits is flipped. Therefore, the 128 bits of this set may be scanned, and at least one of the flips may be guaranteed to be there.

For example, given a frame denoted in standard bit order by x[0:511]. In embodiments, the frozen bits of the polar frame may be denoted as u[0], u[1], u[2] and u[3], as shown below in Equation 11:

$$u[0] = \bigoplus_{i=0,\ldots,511} x[i] \quad \text{Equation 11}$$

$$u[1] = \bigoplus_{i=256,\ldots,511} x[i]$$

$$u[2] = \bigoplus_{i=128,\ldots,255,384,\ldots,511} x[i]$$

$$u[3] = \bigoplus_{i=384,\ldots,511} x[i]$$

By using these frozen bit parity checks we can reduce the bit-flip scan size to 128. For example, based on u[3]==1, the second initial decoder 813 may scan bits 384 through 511. Based on u[1]==1 and u[2]==0, the second initial decoder 813 may can bits 256 through 383. Based on u[1]==0 and u[2]==1, the second initial decoder 813 may scan bits 128 through 255. Otherwise, the second initial decoder 813 may scan bits 0 through 127. However, embodiments are not limited thereto. For example, if additional frozen bits are available, the scan range can be split into more parts, for example eight parts or sixteen parts. In embodiments, the scanning, or the chase, may be performed in any direction.

As discussed above, a new frame may be expected every 16 cycles. Therefore, in order to maintain throughput, the second initial decoder 813 may guess 8 bits in parallel every cycle. In embodiments, based on more than one unique solution being found in the chase, the frame may be declared a failure in order to avoid miscorrection of the frame.

In embodiments, even though a number of bits to be scanned or chased in the smart chase decoding operation may be reduced as discussed above, there still may be a large number of bits to be chase. However, even so, performing the reduced chase may still be much faster than engaging the polar decoder to decode the frame.

In embodiments, the one or more syndrome update module 843 may update the syndromes corresponding to the modified frames. For example, based on t=2, a syndrome update module from among the one or more syndrome update modules 843 may update the a syndrome Si by adding αi and α3i to S1 and S3 accordingly. In embodiments, the one or more syndrome update modules may be implemented using for example one or more of a table and an iterative constant multiplier.

In embodiments, because the second initial decoder 813 may be used to find exactly t+1 errors, and because the first error is guessed as discussed above, the one or more BCH modules 844 may attempt to find exactly t errors. For example, the one or more BCH decoders may check that the condition for exactly t=2 errors is valid, and otherwise the BCH decoding may be considered to be a failure. In embodiments, the condition for exactly t=2 errors may be determined according to Equation 12 below:

$$S1 != 0 \ \&\& \ \Delta_3 ! = 0 \qquad \text{Equation 12}$$

The corresponding ELP may be calculated according to Equation 13 below:

$$ELP = 1 + (S1)X + (\Delta 3/S1)X2 \qquad \text{Equation 13}$$

Figure 9:
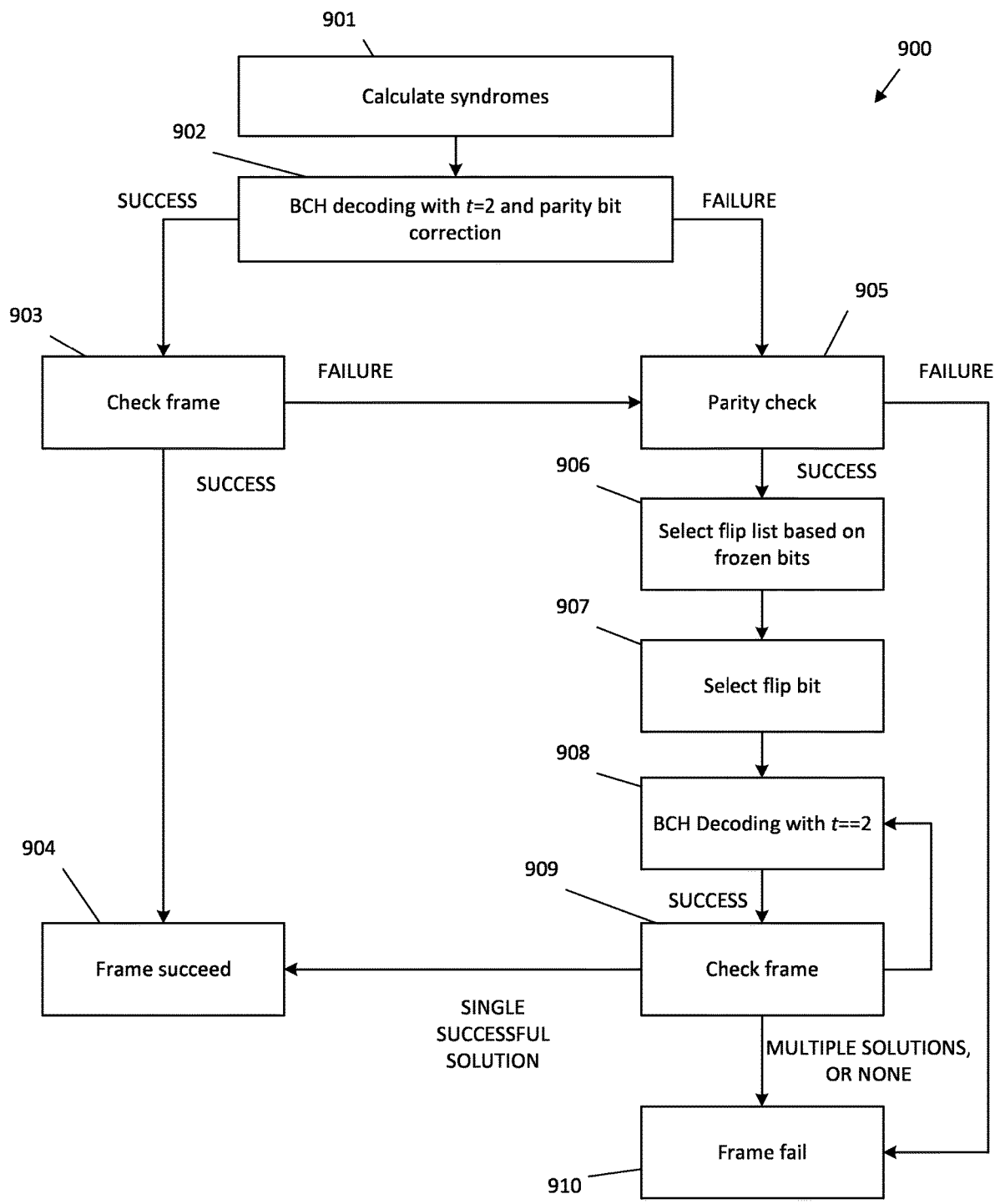
FIG. 9 is a flowchart of a process for performing error correction decoding on a frame, according to embodiments.

FIG. 9 is a flowchart of a process for performing error correction decoding on a frame, according to embodiments. In embodiments, the initial decoder 610 may track live input frames, and therefore the decoding throughput may be determined according to input throughput. For example, in embodiments the input rate may be 32 bits per clock cycle, and therefore a frame input may be complete in 512/32=16 cycles, and therefore each hardware phase may be required to be ready for the next frame after 16 cycles, however embodiments are not limited thereto.

As shown in FIG. 9, at operation 901 the process may include calculating the syndromes of the input frame. The syndromes, for example syndromes S1 and S3, may be ready one cycle after the last input cycle corresponding to the frame, and a new calculation may begin immediately. In embodiments, shortening and alignment may be performed according to code layout. For example, the syndrome calculation module 811 may assume that shortened bits are be located at most significant bits, and so therefore may assume some leading zeroes.

As shown in FIG. 9, at operation 902 the process 900 may include BCH decoding with t=2, and parity bit correction. Based on the syndromes being calculated, for example one cycle after the last input of the frame, the first initial decoder 812 may be activated, and may perform BCH decoding to with an error capability of t, for example t=2, to correct up to 2 erroneous bits. Then, based on the BCH decoding succeeding, for example based on determining that there are 0, 1, or 2 errors, the first initial decoder 812 may correct the frame. Then, the parity fix module 834 may check the parity of the corrected frame based on the additional parity bit p', and may correct the additional parity bit p' if necessary, for example by flipping the additional parity bit p'.

As shown in FIG. 9, at operation 903 the process 900 may include, based on the decoding at operation 902 succeeding, performing a polar check on the frame using the permutation module 835, the polar matrix multiplication module 836, and the frozen check module 837. If the polar check succeeds, operation 903 may be considered to be successful. Otherwise, operation 902 may be considered to be a failure.

In embodiments, operation 901, operation 902, and operation 903 may be performed by elements of the first initial decoder 812, as discussed above. In embodiments, the syndrome calculation may be performed on-the-fly, and therefore may not require any additional cycles beyond the cycles needed to obtain the input frame. Then, the BM module 831 and the CS module 832 may complete their operations in few cycles, for example 3-5 cycles, and the parity fix module 834, the permutation module 835, and polar matrix multiplication module 836 may complete their operations in for example 1-2 cycles.

As shown in FIG. 9, at operation 904 the process 900 may include, based on the polar check at operation 904 succeeding, determining the frame correction to be a success. For example, operation 904 may include outputting the corrected frame as the output frame CR_FRAME0, and setting the signal FR_CORRECT0 to indicate that the output frame CR_FRAME0 is valid.

As shown in FIG. 9, at operation 905 the process 900 may include, based on the BCH decoding at operation 902 failing, or based on the polar check at operation 903 failing, performing a parity check based on the additional parity bit p' using the parity check module 841.

Based on the parity check succeeding at operation 905, the process 900 may include activating other elements of the second initial decoder 813, and proceeding to operations 906-909. In embodiments, operations 906-909 may correspond to the smart chase decoding operation discussed above with reference to FIG. 8D.

As shown in FIG. 9, at operation 906 the process 900 may include, based on the parity check at operation 905 succeeding, selecting a list of flip candidates based on frozen bits. For example, the list of flip candidates may be selected as discussed above with respect to FIG. 8D.

As shown in FIG. 9, at operation 907 the process 900 may include selecting a potential error bit to be flipped from the list of flip candidates, and modifying the frame based on the selected potential error bit.

As shown in FIG. 9, at operation 908 the process 900 may include performing BCH decoding on the modified frame using the one or more BCH modules 844 to attempt to find exactly two errors.

In embodiments, a plurality of potential error bits may be selected in operation 907, and operation 908 may include performing the BCH decoding on a plurality of modified frames corresponding to the plurality of potential error bits in parallel. For example, operation 907 may include selecting eight potential error bits, and operation 908 may be performed on eight modified frames in parallel using eight BCH modules from the one or more BCH modules 844.

As shown in FIG. 9, at operation 909 the process 900 may include, based on the decoding at operation 908 succeeding for one or more frames, performing a polar check on the one or more frames using the polar check module 845.

As shown in FIG. 9, at operation 904 the process 900 may include, based on the polar check at operation 909 succeeding, determining the frame correction to be a success. For example, operation 904 may include outputting the corrected frame as the output frame CR_FRAME1, and setting the signal FR_CORRECT1 to indicate that the output frame CR_FRAME1 is valid.

As shown in FIG. 9, at operation 910 the process 900 may include, based on the polar check at operation 908 indicating multiple solutions, or no solutions, determining that the frame decoding is a failure. For example operation 910 may include determining that the frame cannot be decoded by the initial decoder 610.

Figure 10:
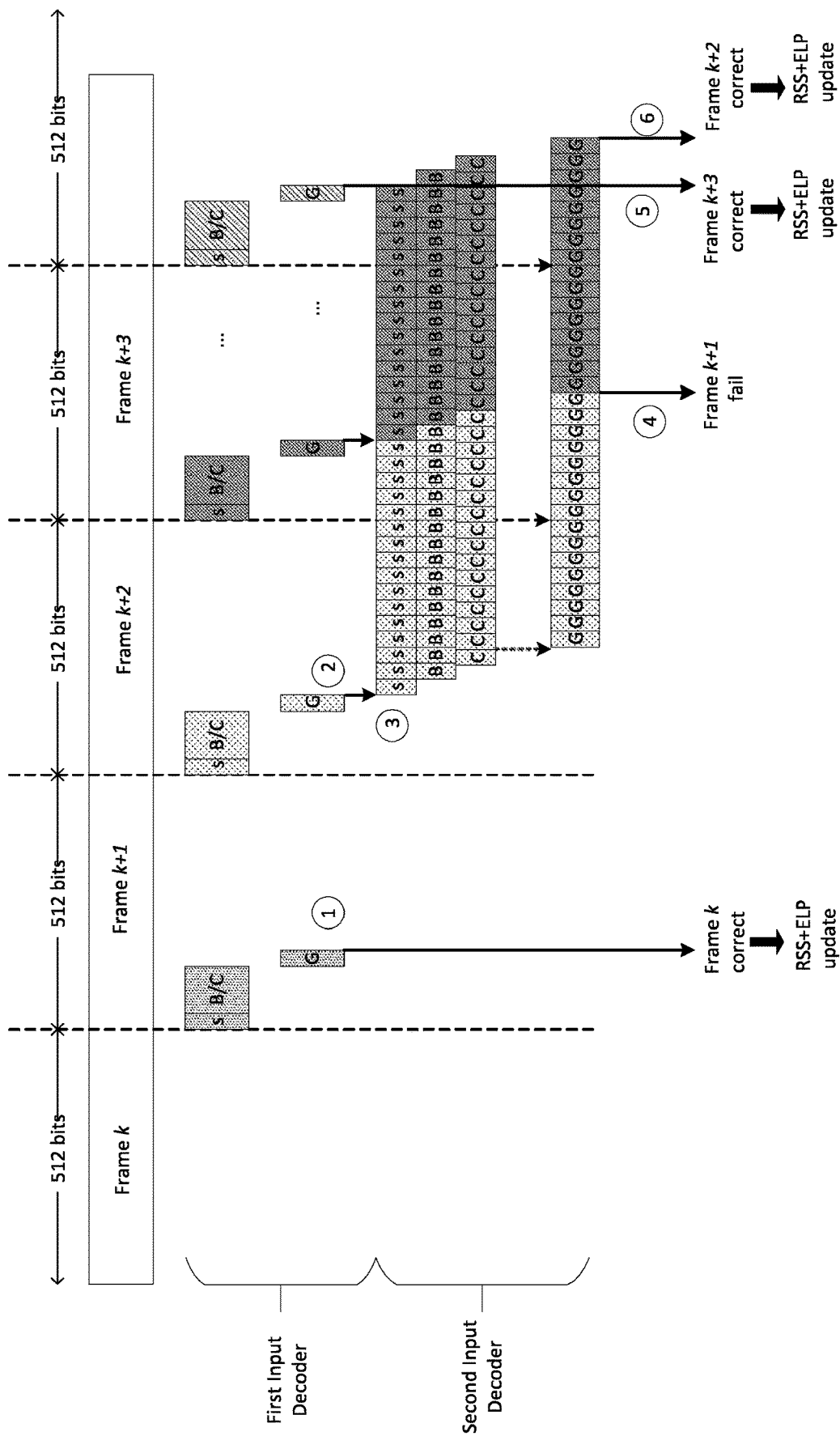
FIG. 10 is a block diagram illustrating a process of decoding multiple frames in parallel, according to embodiments.

FIG. 10 is a block diagram illustrating a process of decoding multiple frames in a parallel pipeline architecture, according to embodiments. As shown in FIG. 10, a plurality of frames including frame k, frame k+1, frame k+2, and frame k+3, each including 512 bits, may be decoded in parallel by an example of the initial decoder 610 which uses an error correction capability of t–2. As shown in FIG. 10, syndrome calculations are denoted "s", BM calculations are denoted "B", CS calculations are denoted "C", and polar check operations are denoted "G".

In the example illustrated in FIG. 10, frame k has less than t+1=3 errors, frame k+1 has more than three errors, frame k+2 has exactly three errors, and frame k+3 has less than three errors.

In particular, as illustrated in FIG. 10, at ①) the first initial decoder 812 successfully decodes frame k. Then, frame k+1 is decoded by the BM module 831 and the CS module 832. However at ②, frame k+1 fails the polar check performed by the frozen check module 837, and at ③ the second initial decoder 813 is activated to begin processing. At ④, the second initial decoder 813 finishes scanning all 128 chase paths, and determines that there is no single solution, for example because there are either zero unique solutions or more than one unique solution. Therefore, the second initial decoder 813 determines at ④ that the initial decoder 610 is incapable of successfully decoding frame k+1, and frame k+1 fails. At ⑤, while frame k+2 is still being decoded by the second initial decoder 813, the first initial decoder 812 successfully decodes frame k+3. Then, at ⑥, the second initial decoder 813 successfully decodes frame k+2. Therefore, as can be seen in FIG. 10, due to the different number of cycle used by the first initial decoder 812 and the second initial decoder 813, frames may be corrected out of order, according to embodiments. As discussed above, in embodiments some stages in the decoder flow may take more than one cycle, however latency may not be an issue as long as the hardware is ready for the next frame every 16 cycles.

Figure 11:
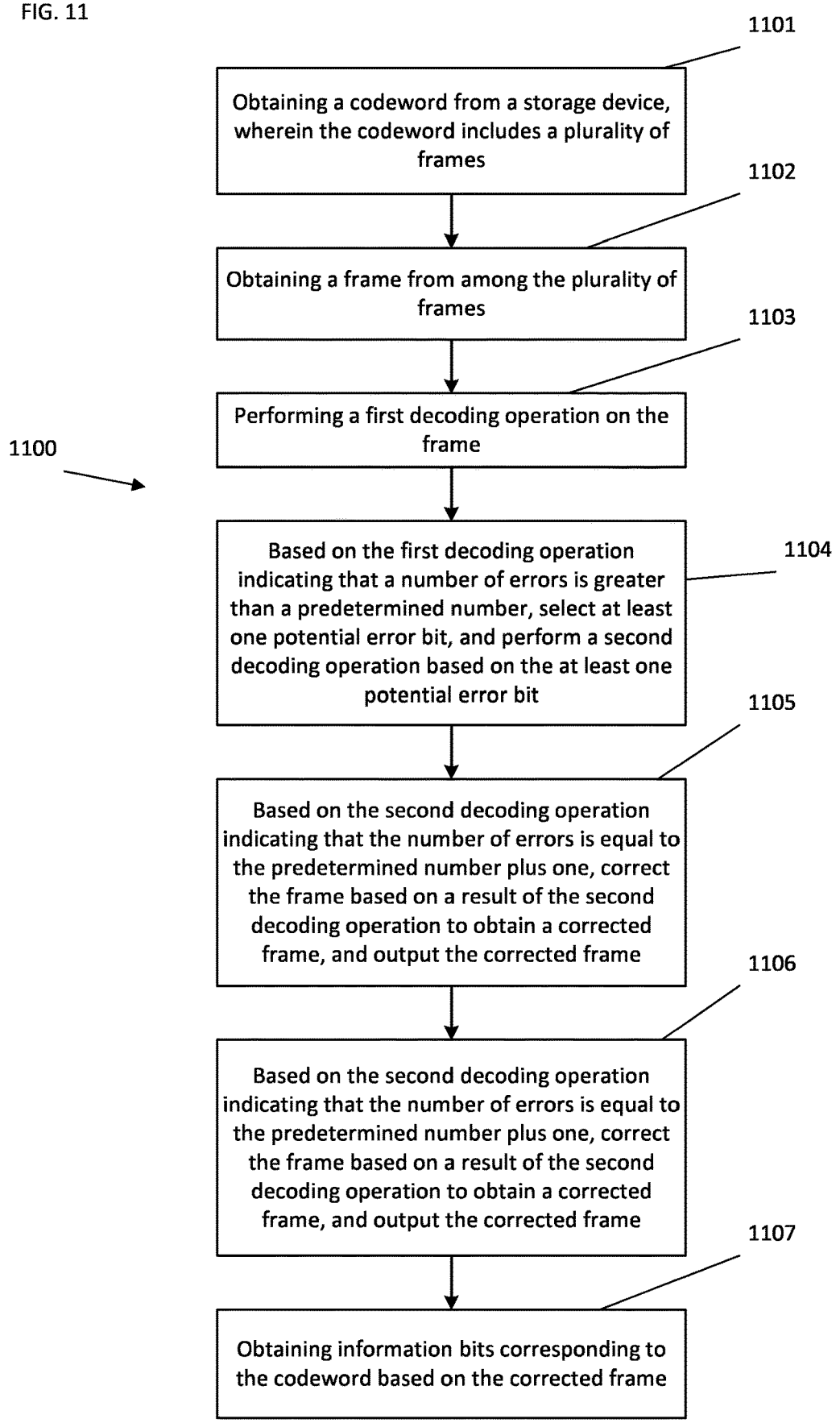
FIG. 11 is a flowchart of a process for controlling a storage system, according to embodiments.

FIG. 11 is a flowchart of a process 11000 of controlling a storage device, according to embodiments. In some implementations, one or more process blocks of FIG. 11 may be performed by the decoder 600, the initial decoder 610, the first initial decoder 812, the second initial decoder 813, or any other element described above with reference to FIGS. 1-10.

As shown in FIG. 11, at operation 1101 the process 11000 may include obtaining a codeword from a storage device. In embodiments, the codeword may correspond to the GCC codeword discussed above, and the plurality of frames may correspond to the frame 700 discussed above.

As further shown in FIG. 11, at operation 1102 the process 11000 may include obtaining a frame from among the plurality of frames.

As further shown in FIG. 11, at operation 1103 the process 11000 may include performing a first decoding operation on the frame. In embodiments, the first decoding operation may correspond to operation 902 performed by the first initial decoder 812, as discussed above.

As further shown in FIG. 11, at operation 1104 the process 11000 may include, based on the first decoding operation indicating that a number of errors is greater than a predetermined number, selecting at least one potential error bit, and performing a second decoding operation based on the at least one potential error bit. In embodiments, the first predetermined number may correspond to the error correcting capability t. In embodiments, the second decoding operation may correspond to the smart chase decoding operation performed by the second initial decoder 813, as discussed above.

As further shown in FIG. 11, at operation 1105 the process 11000 may include, based on the second decoding operation indicating that the number of errors is not equal to the predetermined number plus one, determining that the frame is not correctable by the first decoding operation and the second decoding operation. In embodiments, the first predetermined number plus one may correspond to t+1.

As further shown in FIG. 11, at operation 1106 the process 11000 may include based on the second decoding operation indicating that the number of errors is equal to the predetermined number plus one, correcting the frame based on a result of the second decoding operation to obtain a corrected frame.

As further shown in FIG. 11, at operation 1107 the process 11000 may include. In embodiments, obtaining information bits corresponding to the codeword based on the corrected frame. In embodiments, the information bits correspond to a decoded GCC codeword obtained by the decoder 600 based on the frame decoded by the initial decoder 610.

In embodiments, based on the first decoding operation indicating that the number of errors is greater than the predetermined number, the process 11000 may further include selecting a plurality of potential error bits, and performing a plurality of second decoding operations based on the plurality of potential error bits.

In embodiments, at least one of the first decoding operation and the second decoding operation may include a BCH decoding operation.

In embodiments, the second decoding operation may include modifying the frame by flipping a potential error bit from the selected at least one potential error bit; and performing the BCH decoding operation on the modified frame, and the process 11000 may further include determining that the number of errors is equal to the predetermined number plus one based on the BCH decoding operation indicating that the number of errors is equal to the predetermined number.

In embodiments, based on the first decoding operation indicating that the number of errors is less than or equal to the predetermined number, the process 11000 may further include correcting the frame based on a result of the first decoding operation to obtain a first potential corrected frame, performing a first check operation to determine whether the first potential corrected frame is valid, and based on the first check operation indicating that the first potential corrected frame is valid, determining the corrected frame based on the first potential corrected frame. In embodiments, the first check operation may correspond to operation 903 performed by elements of the first initial decoder 812, as discussed above.

In embodiments, the process 11000 may further include, based on the first check operation indicating that the first potential corrected frame is invalid, performing the second decoding operation.

In embodiments, based on the second decoding operation indicating that the number of errors is equal to the predetermined number plus one, the process 11000 may further include correcting the frame based on a result of the second decoding operation to obtain a second potential corrected frame, performing a second check operation to determine whether the second potential corrected frame is valid, and based on the second check operation indicating that the second potential corrected frame is valid, determining the corrected frame based on the second potential corrected frame. In embodiments, the second check operation may correspond to operation 909 performed by elements of the second initial decoder 813, as discussed above.

In embodiments, the first check operation may include permutating the first potential corrected frame to obtain a first polar frame, multiplying the first polar frame by a polar generator matrix, and checking frozen bits corresponding to the first polar frame, and the second check operation may include permutating the second potential corrected frame to obtain a second polar frame, multiplying the second polar frame by the polar generator matrix, and checking frozen bits corresponding to the second polar frame.

Although FIG. 11 shows example blocks of process 11000, in some implementations, the process 11000 may include additional blocks, fewer blocks, different blocks, or differently arranged blocks than those depicted in FIG. 11. Additionally, or alternatively, two or more of the blocks of the process 11000 may be arranged or combined in any order, or performed in parallel.

Figure 12:
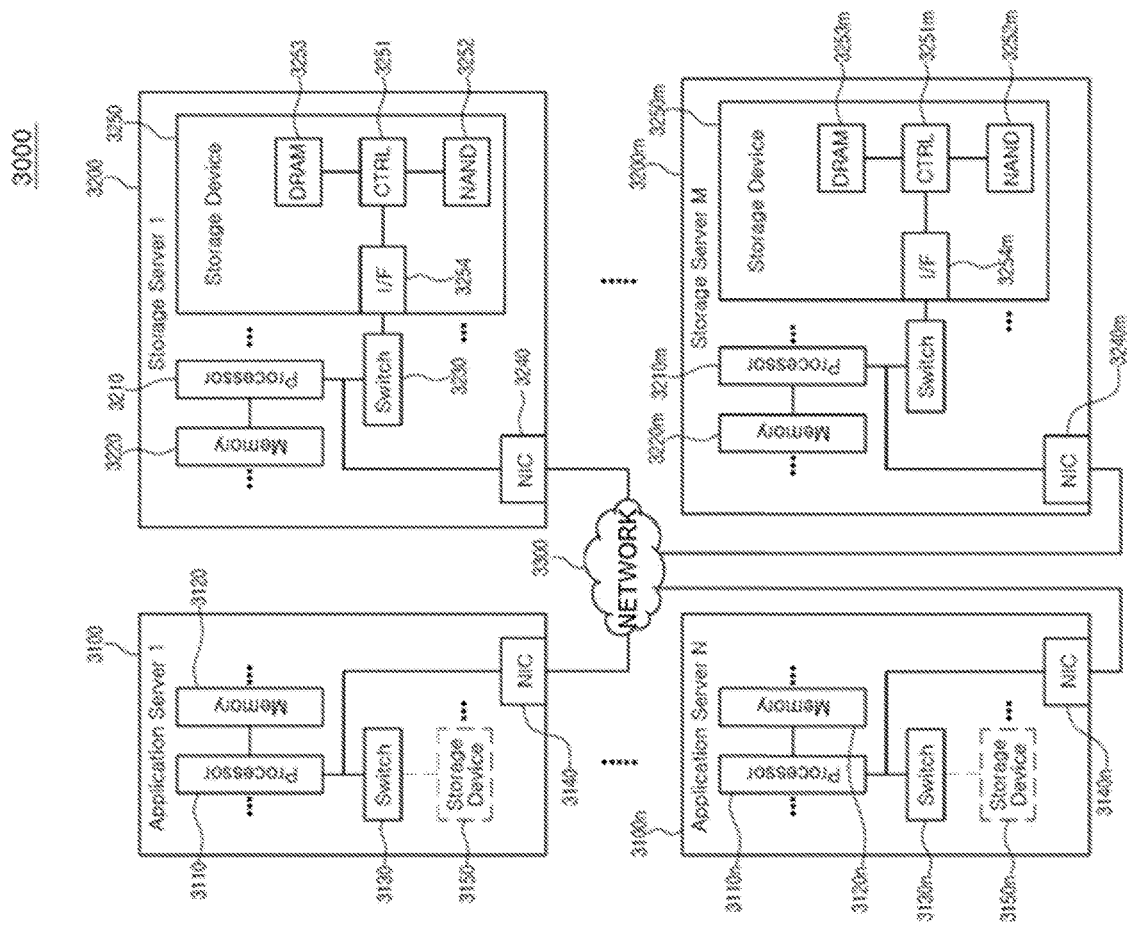
FIG. 12 is a block diagram of data center, according to embodiments.

FIG. 12 is a diagram of a data center 3000 to which a memory device is applied, according to embodiments.

Referring to FIG. 12, the data center 3000 may be a facility that collects various types of pieces of data and provides services and be referred to as a data storage center. The data center 3000 may be a system for operating a search engine and a database, and may be a computing system used by companies, such as banks, or government agencies. The data center 3000 may include application servers 3100 to 3100*n* and storage servers 3200 to 3200*m*. The number of application servers 3100 to 3100*n* and the number of storage servers 3200 to 3200*m* may be variously selected according to embodiments. The number of application servers 3100 to 3100*n* may be different from the number of storage servers 3200 to 3200*m*.

The application server 3100 or the storage server 3200 may include at least one of processors 3110 and 3210 and memories 3120 and 3220. The storage server 3200 will now be described as an example. The processor 3210 may control all operations of the storage server 3200, access the memory 3220, and execute instructions and/or data loaded in the memory 3220. The memory 3220 may be a double-data-rate synchronous DRAM (DDR SDRAM), a high-bandwidth memory (HBM), a hybrid memory cube (HMC), a dual in-line memory module (DIMM), Optane DIMM, and/or a non-volatile DIMM (NVMDIMM). In some embodiments, the numbers of processors 3210 and memories 3220 included in the storage server 3200 may be variously selected. In embodiments, the processor 3210 and the memory 3220 may provide a processor-memory pair. In embodiments, the number of processors 3210 may be different from the number of memories 3220. The processor 3210 may include a single-core processor or a multi-core processor. The above description of the storage server 3200 may be similarly applied to the application server 3100. In some embodiments, the application server 3100 may not include a storage device 3150. The storage server 3200 may include at least one storage device 3250. The number of storage devices 3250 included in the storage server 3200 may be variously selected according to embodiments.

The application servers 3100 to 3100*n* may communicate with the storage servers 3200 to 3200*m* through a network 3300. The network 3300 may be implemented by using a fiber channel (FC) or Ethernet. In this case, the FC may be a medium used for relatively high-speed data transmission and use an optical switch with high performance and high availability. The storage servers 3200 to 3200*m* may be provided as file storages, block storages, or object storages according to an access method of the network 3300.

In embodiments, the network 3300 may be a storage-dedicated network, such as a storage area network (SAN). For example, the SAN may be an FC-SAN, which uses an FC network and is implemented according to an FC protocol (FCP). As another example, the SAN may be an Internet protocol (IP)-SAN, which uses a transmission control protocol (TCP)/IP network and is implemented according to a SCSI over TCP/IP or Internet SCSI (iSCSI) protocol. In another embodiment, the network 3300 may be a general network, such as a TCP/IP network. For example, the network 3300 may be implemented according to a protocol, such as FC over Ethernet (FCoE), network attached storage (NAS), and NVMe over Fabrics (NVMe-oF).

Hereinafter, the application server 3100 and the storage server 3200 will mainly be described. A description of the application server 3100 may be applied to another application server 3100*n*, and a description of the storage server 3200 may be applied to another storage server 3200*m*.

The application server 3100 may store data, which is requested by a user or a client to be stored, in one of the storage servers 3200 to 3200*m* through the network 3300. Also, the application server 3100 may obtain data, which is requested by the user or the client to be read, from one of the storage servers 3200 to 3200*m* through the network 3300. For example, the application server 3100 may be implemented as a web server or a database management system (DBMS).

The application server 3100 may access a memory 3120*n* or a storage device 3150*n*, which is included in another application server 3100*n*, through the network 3300. Alternatively, the application server 3100 may access memories 3220 to 3220*m* or storage devices 3250 to 3250*m*, which are included in the storage servers 3200 to 3200*m*, through the network 3300. Thus, the application server 3100 may perform various operations on data stored in application servers 3100 to 3100*n* and/or the storage servers 3200 to 3200*m*. For example, the application server 3100 may execute an instruction for moving or copying data between the application servers 3100 to 3100*n* and/or the storage servers 3200 to 3200*m*. In this case, the data may be moved from the storage devices 3250 to 3250*m* of the storage servers 3200 to 3200*m* to the memories 3120 to 3120*n* of the application servers 3100 to 3100*n* directly or through the memories 3220 to 3220*m* of the storage servers 3200 to 3200*m*. The data moved through the network 3300 may be data encrypted for security or privacy.

The storage server 3200 will now be described as an example. An interface 3254 may provide physical connection between a processor 3210 and a controller 3251 and a physical connection between a network interface card (NIC) 3240 and the controller 3251. For example, the interface 3254 may be implemented using a direct attached storage (DAS) scheme in which the storage device 3250 is directly connected with a dedicated cable. For example, the interface 3254 may be implemented by using various interface schemes, such as ATA, SATA, e-SATA, an SCSI, SAS, PCI, PCIe, NVMe, IEEE 1394, a USB interface, an SD card interface, an MMC interface, an eMMC interface, a UFS interface, an eUFS interface, and/or a CF card interface.

The storage server 3200 may further include a switch 3230 and the NIC(Network InterConnect) 3240. The switch 3230 may selectively connect the processor 3210 to the storage device 3250 or selectively connect the NIC 3240 to the storage device 3250 via the control of the processor 3210.

In embodiments, the NIC 3240 may include a network interface card and a network adaptor. The NIC 3240 may be connected to the network 3300 by a wired interface, a wireless interface, a Bluetooth interface, or an optical interface. The NIC 3240 may include an internal memory, a digital signal processor (DSP), and a host bus interface and be connected to the processor 3210 and/or the switch 3230 through the host bus interface. The host bus interface may be implemented as one of the above-described examples of the interface 3254. In embodiments, the NIC 3240 may be integrated with at least one of the processor 3210, the switch 3230, and the storage device 3250.

In the storage servers 3200 to 3200m or the application servers 3100 to 3100n, a processor may transmit a command to storage devices 3150 to 3150n and 3250 to 3250m or the memories 3120 to 3120n and 3220 to 3220m and program or read data. In this case, the data may be data of which an error is corrected by an ECC engine. The data may be data on which a data bus inversion (DBI) operation or a data masking (DM) operation is performed, and may include cyclic redundancy code (CRC) information. The data may be data encrypted for security or privacy.

Storage devices 3150 to 3150n and 3250 to 3250m may transmit a control signal and a command/address signal to NAND flash memory devices 3252 to 3252m in response to a read command received from the processor. Thus, when data is read from the NAND flash memory devices 3252 to 3252m, a read enable (RE) signal may be input as a data output control signal, and thus, the data may be output to a DQ bus. A data strobe signal DQS may be generated using the RE signal. The command and the address signal may be latched in a page buffer depending on a rising edge or falling edge of a write enable (WE) signal.

The controller 3251 may control all operations of the storage device 3250. In embodiments, the controller 3251 may include SRAM. The controller 3251 may write data to the NAND flash memory device 3252 in response to a write command or read data from the NAND flash memory device 3252 in response to a read command. For example, the write command and/or the read command may be provided from the processor 3210 of the storage server 3200, the processor 3210m of another storage server 3200m, or the processors 3110 and 3110n of the application servers 3100 and 3100n. DRAM 3253 may temporarily store (or buffer) data to be written to the NAND flash memory device 3252 or data read from the NAND flash memory device 3252. Also, the DRAM 3253 may store metadata. Here, the metadata may be user data or data generated by the controller 3251 to manage the NAND flash memory device 3252. The storage device 3250 may include a secure element (SE) for security or privacy.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

The various operations of methods described above may be performed by any suitable means capable of performing the operations, such as various hardware and/or software component(s), circuits, and/or module(s).

The software may include an ordered listing of executable instructions for implementing logical functions, and can be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The foregoing is illustrative of certain embodiments and is not to be construed as limiting thereof. Although a few embodiments have been described, those skilled in the art will readily appreciate that many modifications are possible in the embodiments without materially departing from the present scope.

What is claimed is:

1. A storage system comprising:
a storage device configured to store a plurality of codewords; and
at least one processor configured to:
obtain a frame corresponding to a codeword from the storage device,
perform a first decoding operation on the frame,
based on the first decoding operation indicating that a number of errors is greater than a predetermined number, select at least one potential error bit, and perform a second decoding operation based on the at least one potential error bit,
based on the second decoding operation indicating that the number of errors is not equal to the predetermined number plus one, determine that a result of the first decoding operation is invalid, or that the frame is not correctable by the second decoding operation, and
based on the second decoding operation indicating that the number of errors is equal to the predetermined number plus one, correct the frame based on a result of the second decoding operation to obtain a corrected frame, and
obtain information bits corresponding to the codeword based on the corrected frame.

2. The storage system of claim 1, wherein the at least one processor is further configured to, based on the first decoding operation indicating that the number of errors is greater than the predetermined number:
select a plurality of potential error bits, and
perform a plurality of second decoding operations based on the plurality of potential error bits.

3. The storage system of claim 1, wherein at least one of the first decoding operation and the second decoding operation comprises a Bose-Chaudhuri-Hocquenghem (BCH) decoding operation.

4. The storage system of claim 3, wherein to perform the second decoding operation, the at least one processor is further configured to:
modify the frame by flipping a potential error bit from among the selected at least one potential error bit; and
perform the BCH decoding operation on the modified frame, and
wherein the at least one processor is further configured to determine that the number of errors is equal to the predetermined number plus one based on the BCH decoding operation indicating that the number of errors is equal to the predetermined number.

5. The storage system of claim 1, wherein the at least one processor is further configured to, based on the first decoding operation indicating that the number of errors is less than or equal to the predetermined number:
correct the frame based on the result of the first decoding operation to obtain a first potential corrected frame,
perform a first check operation to determine whether the first potential corrected frame is valid, and
based on the first check operation indicating that the first potential corrected frame is valid, determine the corrected frame based on the first potential corrected frame.

6. The storage system of claim 5, wherein the at least one processor is further configured to perform the second decoding operation based on the first check operation indicating that the first potential corrected frame is invalid.

7. The storage system of claim 6, wherein the at least one processor is further configured to, based on the second decoding operation indicating that the number of errors is equal to the predetermined number plus one:
correct the frame based on a result of the second decoding operation to obtain a second potential corrected frame,
perform a second check operation to determine whether the second potential corrected frame is valid, and
based on the second check operation indicating that the second potential corrected frame is valid, determine the corrected frame based on the second potential corrected frame.

8. The storage system of claim 7, wherein the first check operation comprises permutating the first potential corrected frame to obtain a first polar frame, multiplying the first polar frame by a polar generator matrix, and checking frozen bits corresponding to the first polar frame, and
wherein the second check operation comprises permutating the second potential corrected frame to obtain a second polar frame, multiplying the second polar frame by the polar generator matrix, and checking frozen bits corresponding to the second polar frame.

9. A device for decoding a codeword which comprises a plurality of frames, the device comprising:
at least one processor configured to:
obtain a frame corresponding to the codeword from a storage device,
perform first Bose-Chaudhuri-Hocquenghem (BCH) decoding on the frame,
based on the first BCH decoding indicating that a number of errors is greater than a predetermined number, select at least one potential error bit, and perform second BCH decoding based on the at least one potential error bit,
based on the second BCH decoding indicating that the number of errors is not equal to the predetermined number plus one, determine that a result of the first BCH decoding is invalid, or that the frame is not correctable by the second BCH decoding,
based on the second BCH decoding indicating that the number of errors is equal to the predetermined number plus one, correct the frame based on a result of the second BCH decoding to obtain a corrected frame, and
obtain information bits corresponding to the codeword based on the corrected frame.

10. The device of claim 9, wherein the at least one processor is further configured to, based on the first BCH decoding indicating that the number of errors is greater than the predetermined number:
select a plurality of potential error bits, and
perform a plurality of second decoding operations based on the plurality of potential error bits.

11. The device of claim 9, wherein the at least one processor is further configured to, based on the first BCH decoding indicating that the number of errors is less than or equal to the predetermined number:
correct the frame based on a result of the first BCH decoding to obtain a potential corrected frame,
permute the potential corrected frame to obtain a polar frame,
multiply the polar frame by a polar generator matrix,
obtain frozen bits based on a result of the multiplication, and
based on the frozen bits being equal to zero, determine the corrected frame based on the potential corrected frame.

12. The device of claim 11, wherein the at least one processor is further configured to perform the second BCH decoding on a narrowed range based on the frozen bits being not equal to zero.

13. The device of claim 9, wherein the at least one processor is further configured to, based on the second BCH decoding indicating that the number of errors is equal to the predetermined number plus one:
  correct the frame based on a result of the second BCH decoding to obtain a potential corrected frame,
  permute the potential corrected frame to obtain a polar frame,
  multiply the polar frame by a polar generator matrix,
  obtain frozen bits based on a result of the multiplication, and
  based on the frozen bits being equal to zero, determine the corrected frame based on the potential corrected frame.

14. A method of controlling a storage system, the method being executed by at least one processor and comprising:
  obtaining a codeword from a storage device, wherein the codeword includes a plurality of frames,
  obtaining a frame from among the plurality of frames;
  performing a first decoding operation on the frame;
  based on the first decoding operation indicating that a number of errors is greater than a predetermined number, selecting at least one potential error bit, and performing a second decoding operation based on the at least one potential error bit;
  based on the second decoding operation indicating that the number of errors is not equal to the predetermined number plus one, determining that a result of the first decoding operation is invalid, or that the frame is not correctable by the second decoding operation;
  based on the second decoding operation indicating that the number of errors is equal to the predetermined number plus one, correcting the frame based on a result of the second decoding operation to obtain a corrected frame; and
  obtaining information bits corresponding to the codeword based on the corrected frame.

15. The method of claim 14, further comprising:
  based on the first decoding operation indicating that the number of errors is greater than the predetermined number, selecting a plurality of potential error bits, and performing a plurality of second decoding operations based on the plurality of potential error bits.

16. The method of claim 14, wherein at least one of the first decoding operation and the second decoding operation comprises a Bose-Chaudhuri-Hocquenghem (BCH) decoding operation.

17. The method of claim 16, wherein the second decoding operation comprises:
  modifying the frame by flipping a potential error bit from among the selected at least one potential error bit; and
  performing the BCH decoding operation on the modified frame, and
  wherein the method further comprises determining that the number of errors is equal to the predetermined number plus one based on the BCH decoding operation indicating that the number of errors is equal to the predetermined number.

18. The method of claim 14, further comprising, based on the first decoding operation indicating that the number of errors is less than or equal to the predetermined number:
  correcting the frame based on the result of the first decoding operation to obtain a first potential corrected frame;
  performing a first check operation to determine whether the first potential corrected frame is valid; and
  based on the first check operation indicating that the first potential corrected frame is valid, determining the corrected frame based on the first potential corrected frame.

19. The method of claim 18, further comprising:
  based on the first check operation indicating that the first potential corrected frame is invalid, performing the second decoding operation.

20. The method of claim 19, further comprising, based on the second decoding operation indicating that the number of errors is equal to the predetermined number plus one:
  correcting the frame based on a result of the second decoding operation to obtain a second potential corrected frame;
  performing a second check operation to determine whether the second potential corrected frame is valid; and
  based on the second check operation indicating that the second potential corrected frame is valid, determining the corrected frame based on the second potential corrected frame.

* * * * *